US011527433B2

(12) United States Patent
Guler et al.

(10) Patent No.: US 11,527,433 B2
(45) Date of Patent: Dec. 13, 2022

(54) VIA AND PLUG ARCHITECTURES FOR INTEGRATED CIRCUIT INTERCONNECTS AND METHODS OF MANUFACTURE

(71) Applicant: Intel Corporation, Santa Clara, CA (US)

(72) Inventors: Leonard P. Guler, Hillsboro, OR (US); Charles H. Wallace, Portland, OR (US); Paul A. Nyhus, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 745 days.

(21) Appl. No.: 16/330,367

(22) PCT Filed: Sep. 30, 2016

(86) PCT No.: PCT/US2016/054770
§ 371 (c)(1),
(2) Date: Mar. 4, 2019

(87) PCT Pub. No.: WO2018/063323
PCT Pub. Date: Apr. 5, 2018

(65) Prior Publication Data
US 2021/0313222 A1 Oct. 7, 2021

(51) Int. Cl.
*H01L 21/768* (2006.01)
*H01L 23/522* (2006.01)
(52) U.S. Cl.
CPC .. *H01L 21/76811* (2013.01); *H01L 21/76877* (2013.01); *H01L 23/5226* (2013.01)
(58) Field of Classification Search
CPC ...... G03F 7/0045; G03F 7/2002; G03F 7/095; G03F 7/2022; G03F 7/32; G03F 7/0382;
(Continued)

(56) References Cited

U.S. PATENT DOCUMENTS 4,107,726 A * 8/1978 Schilling ........... H01L 21/28518
257/763
9,041,217 B1 * 5/2015 Bristol ................ H01L 21/0337
257/774
(Continued)

FOREIGN PATENT DOCUMENTS

WO WO-2007113108 A1 * 10/2007 ......... H01L 21/7682
WO WO-2015047320 A1 * 4/2015 ....... H01L 23/49894

OTHER PUBLICATIONS

International Preliminary Report on Patentability for International Patent Application No. PCT/US2016/05470, dated Jun. 27, 2017.
(Continued)

*Primary Examiner* — Eva Y Montalvo
*Assistant Examiner* — Tenley H Schofield
(74) *Attorney, Agent, or Firm* — Essential Patents Group, LLP

(57) ABSTRACT

Methods and architectures for forming metal line plugs that define separations between two metal line ends, and for forming vias that interconnect the metal lines to an underlying contact. The line plugs are present in-plane with the metal lines while vias connecting the lines are in an underlying plane. One lithographic plate or reticle that prints lines at a given pitch (P) may be employed multiple times, for example each time with a pitch halving (P/2), or pitch quartering (P/4) patterning technique, to define both metal line ends and metal line vias. A one-dimensional (1D) grating mask may be employed in conjunction with cross-grating (orthogonal) masking structures that are likewise amenable to pitch splitting techniques.

7 Claims, 17 Drawing Sheets

(58) Field of Classification Search
CPC ........ G03F 7/2004; G03F 7/38; G03F 7/0392; H01L 21/0274; H01L 21/76897; H01L 21/31144; H01L 21/0271; H01L 21/76808; H01L 21/76816; H01L 23/49827; C08F 212/14; C08F 212/32
See application file for complete search history.

(56) References Cited

U.S. PATENT DOCUMENTS

| | | | |
|---|---|---|---|
| 9,478,462 B1* | 10/2016 | Wang | H01L 21/76897 |
| 9,793,164 B2* | 10/2017 | Machkaoutsan | H01L 21/76897 |
| 10,410,913 B2* | 9/2019 | Shieh | H01L 21/76895 |
| 2005/0074961 A1* | 4/2005 | Beyer | H01L 21/764 438/619 |
| 2009/0200683 A1* | 8/2009 | Colburn | H01L 21/76811 257/774 |
| 2011/0241220 A1* | 10/2011 | Anderson | H01L 23/5222 257/776 |
| 2012/0313251 A1* | 12/2012 | Kato | H01L 21/76813 257/E21.219 |
| 2013/0260559 A1 | 10/2013 | Park et al. | |
| 2013/0313717 A1* | 11/2013 | Holmes | H01L 23/528 257/774 |
| 2014/0210098 A1* | 7/2014 | Jezewski | H01L 23/5329 257/774 |
| 2016/0104642 A1 | 4/2016 | Bristol et al. | |
| 2016/0126184 A1 | 5/2016 | Myers et al. | |
| 2016/0190009 A1 | 6/2016 | Wallace et al. | |
| 2016/0197011 A1 | 7/2016 | Bristol et al. | |
| 2017/0301715 A1* | 10/2017 | Cheng | H01L 27/14632 |

OTHER PUBLICATIONS

International Preliminary Report on Patentability from PCT/US2016/054770 dated Apr. 11, 2019, 10 pgs.

* cited by examiner

VIA AND PLUG ARCHITECTURES FOR INTEGRATED CIRCUIT INTERCONNECTS AND METHODS OF MANUFACTURE

CLAIM OF PRIORITY

This Application is a National Stage Entry of, and claims priority to, PCT Application No. PCT/US2016/054770, filed on Sep. 30, 2016 and titled "VIA & PLUG ARCHITECTURES FOR INTEGRATED CIRCUIT INTERCONNECTS & METHODS OF MANUFACTURE", which is incorporated by reference in its entirety for all purposes.

BACKGROUND

Cell density in integrated circuits (ICs) continues to increase. Integrated circuits (e.g., microprocessors, chipset components, graphics chips, memory chips, optical chips, etc.) commonly include electrically conductive features, such as lines, separate layers of which are coupled together by vias. To date, vias are typically formed by a lithographic process in which a photoresist layer may be spin coated over a dielectric layer. The photoresist layer may be exposed to radiation, and the exposed photoresist developed in order to form an opening. Next, an opening for the via may be etched in the dielectric layer by using the photoresist layer as an etch mask. This opening is referred to as a via opening. Finally, the via opening may be back filled with one or more metals or other conductive materials to form the conductive via.

One measure of the size is the critical dimension of the via or line. One measure of the spacing of the vias or lines is the pitch. In the past, the sizes and the spacing of vias and lines has progressively decreased. However, when patterning extremely small conductive line ends having extremely small pitches by lithographic processes, several challenges present themselves, especially when the pitches are around 70 nanometers (nm) or less and/or when the critical dimensions of the line ends are around 35 nm, or less. One challenge is that the critical dimensions of the line ends generally tend to scale faster than the resolution capabilities of the lithographic scanners. A further challenge is that the extremely small via pitches generally tend to be below the resolution capabilities of even extreme ultraviolet (EUV) lithographic scanners. As a result, it is common now for two, three, or more different lithographic masks to be used to form an IC interconnect structure. Such multiple patterning processes can increase the costs dramatically, making it the integration of such processes very important to final IC chip cost.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1A:
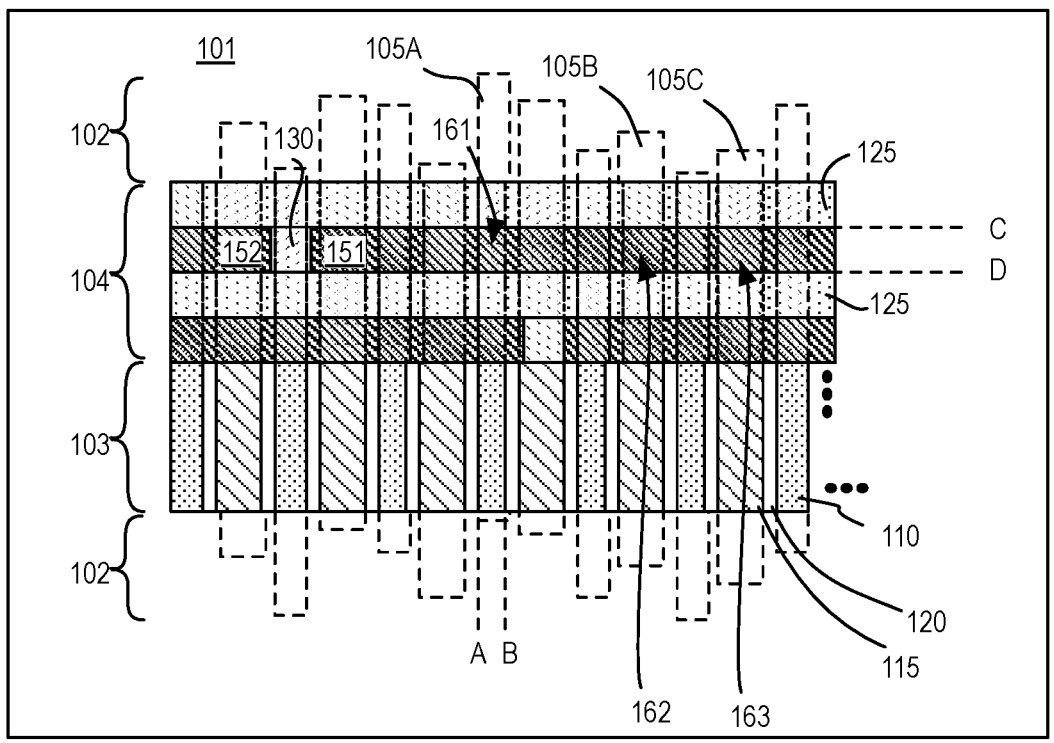
FIG. 1A is plan view of a IC cell, including vias and plugs disposed over a multi-colored dielectric layer, in accordance with some embodiments.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that embodiments may be practiced without these specific details. In some instances, well-known methods and devices are shown in block diagram form, rather than in detail, to avoid obscuring the embodiments. Reference throughout this specification to "an embodiment" or "one embodiment" or "some embodiments" means that a particular feature, structure, function, or characteristic described in connection with the embodiment is included in at least one embodiment. Thus, the appearances of the phrase "in an embodiment" or "in one embodiment" or "some embodiments" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example in the context of materials, one material or material disposed over or under another may be directly in contact or may have one or more intervening materials. Moreover, one material disposed between two materials or materials may be directly in contact with the two layers or may have one or more intervening layers. In contrast, a first material or material "on" a second material or material is in direct contact with that second material/material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Methods and architectures associated with metal line plugs that define separations between two metal line ends and vias that interconnect the metal lines to an underlying contact point are described below. The line "plugs" are non-conductive (dielectric) spaces or interruptions between metals lines, which may also be referred to as "line ends," "pillars," "posts" or "cuts" in lines that would otherwise be electrically continuous. As such, plugs are present in-plane or the same level with the metal lines while vias connecting the lines are in an underlying plane. Given the structural distinctions, it can be challenging to make such features without employing two or more distinct mask sets. In accordance with some embodiments described further below however, one lithographic plate or reticle that prints photoresist mask "backbone" lines at a given pitch (P) may be employed multiple times, for example each time with a pitch halving (P/2), or pitch quartering (P/4) hardmask patterning technique, to define both metal line ends and metal line vias. As such, a complex dual-damascene type structure can be fabricated at the scaled-down geometries achievable with pitch splitting techniques. Some exemplary embodiments described below illustrate the use of one-dimensional (1D) grating mask structures. A grating mask is advantageously amenable to pitch splitting techniques, and may be further employed in conjunction with cross-grating (orthogonal) masking structures that are themselves likewise amenable to pitch splitting techniques. The exemplary embodiments described below illustrate the fabrication of 2D interconnect features from such orthogonal 1D masking layers. Exemplary embodiments described below also illustrate how a "multi-colored" ILD layer included in the ILD stack can be integrated into a dual-damascene interconnect fabrication process to further confine via profiles on the basis of etch selectivity. One or more of these features may be practiced in accordance with embodiments further described herein.

Some embodiments described below also illustrate structural features indicative of fabrication processes applying the principles taught herein. Hence, while various mask structures described herein are ephemeral, final structures in the IC that provide a lasting fingerprint of the fabrication process are highlighted in the description below. For example, conductive vias and dielectric plugs fabricated as described below may have a substantially rectangular footprint, which is indicative of the intersecting edges of etched polygons having been discretely defined by separate orthogonal 1D grating masks. As such, the corner rounding typical of lithographically defined corners is substantially absent. As another example, an interlayer dielectric (ILD) residue may be disposed between two adjacent vias that extend through a homogenous ILD material and are electrically interconnected by the same metal line. Because of their electrical interconnection, there may be no apparent functional reason to have two vias where a single larger via would be similarly operable. Furthermore, because of the ILD homogeneity, the residue between the adjacent vias is distinct from an artifact of etch selectivity. Hence, the residue is a structural indication of the fabrication techniques described herein.

Figure 1B:
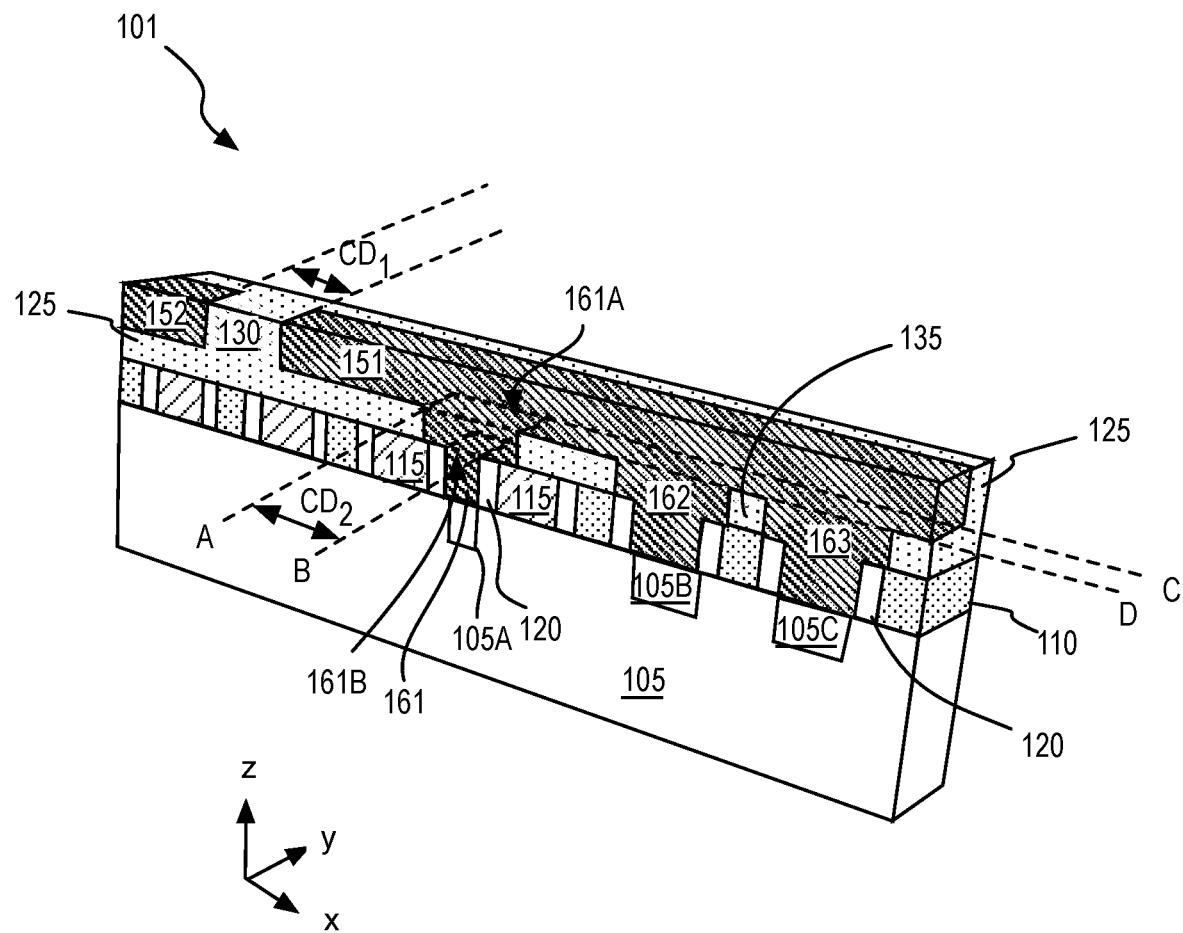
FIG. 1B is a perspective view of a portion of the IC cell illustrated in FIG. 1A, in accordance with some embodiments.

FIG. 1A is plan view of an IC cell 101, including vias and plugs disposed over a multi-colored dielectric layer, in accordance with some embodiments. FIG. 1B is a perspective view of a portion of the IC cell 101, in accordance with some embodiments. Referring first to FIG. 1A, within IC cell 101, lines 102 extending lengthwise in a first dimension (e.g., y-dimension). Lines 102 are illustrated in dashed line as being a reference lower-level material within an IC over which upper-level material layers are disposed. Critical dimensions of lines 102 may vary with technology node. In some embodiments lines 102 have approximately 50 nanometer pitch, or less. Lines 102 may be of any conductive material, as embodiments herein are not limited in this context. For example, lines 102 may be a metallic (e.g., Cu, Al, etc.), doped semiconductor (e.g., polysilicon, etc.), or the like. Lines 102 may be separated by intervening dielectric spaces. Within IC cell 101, lines 102 may have any function, such as, but not limited to, gate electrodes, source/drain contact metallization, or interconnect metallization. As such, lines 102 may originate from a front-end end of an IC fabrication flow, or may originate from a back-end of an IC fabrication flow. Lines 102 may include an array of any number of lines. In some embodiments, lines 102 include one or more pairs of conductive lines or traces having sidewalls that define a space there between.

Lines 103 are disposed over lines 102, and are therefore illustrated in solid line in FIG. 1A. As shown, lines 103 also extend lengthwise in the first dimension (e.g., y-dimension). Lines 103 may include an array of any number of lines. In some embodiments, lines 103 include one or more pairs of lines having sidewalls that define a space there between. Critical dimensions of lines 103 may vary with technology node. In some embodiments lines 103 have approximately 60 nanometer pitch, or less. Although in the exemplary embodiment lines 103 and lines 102 are substantially parallel, they may be substantially orthogonal in alternative embodiments. In some embodiments, lines 103 are dielectric material stripes. In the exemplary embodiment shown, lines 103 comprise a multi-colored ILD layer including a plurality of interdigitated dielectric material stripes of distinct composition. More specifically, lines 103 comprise a tri-colored ILD layer including first dielectric material stripes 110 separated from second dielectric material stripes 115 by a third dielectric material stripe 120. If these tri-color elements are mapped to an RGB color space, the 1D array of lines 103 form a spatially repeating RGBG series of ILD materials. As such, a subset of lines 102 disposed below material stripes 110 (R) are interdigitated with a subset of lines 102 disposed below material stripes 115 (B) with material stripe 120 in intervening spaces. Although a 1D hard mask array is illustrated in FIG. 1A, a 2D spatial hard mask array having this same RGBG arrangement is also possible. Material stripes 110, 115 120 may be a set of any known dielectric materials, as embodiments are not limited in the context. In some examples, each of material stripes 110, 115, 120 is selected from the group including SiC, SiN, SiCN, SiO, SiOC, diamond-like carbon (DLC), and silicon-doped DLC (Si-DLC). The group IV constituent might also be replaced, (e.g., germanium nitrides, metal germanides, and germanium-doped diamond-like carbon, etc.).

Lines 104 are disposed over lines 103, and are also illustrated in solid lines in FIG. 1A. As such, only a portion of the series of lines 104 are shown, with ellipses to represent a continuation of the 1D pattern. Lines 104 extend lengthwise in a second dimension (e.g., x-dimension), orthogonal to lines 102. Lines 104 may include an array of any number of lines. In some embodiments, lines 104 include pairs of conductive traces having sidewalls that define a space there between. In some embodiments, lines 104 include stripes of ILD material 125 separating conductive traces 151, 152. In addition to separating adjacent longitudinal lengths of conductive traces, ends of the conductive traces are separated by dielectric plugs or pillars 130. Critical dimensions of lines 104 may vary with technology node. In some embodiments lines 104 have approximately 60 nanometer pitch, or less. Conductive traces 151, 152 may be any material known to be suitable for carrying an IC current/voltage, such as, but not limited to, a metallic (e.g., Cu, Al, etc.) or doped semiconductor (e.g., polysilicon, etc.).

One or more conductive vias interconnect conductive trace 151 with one or more lines 102. Such vias are defined by an intersection or cross-point of the 1D grating levels. For example, lines 103 define edges A and B in FIG. 1A that delineate a via 161 where they intersect with edges C, D defined by lines 104. Via 161 electrically connects trace 151 to line 105A underlying the square having the perimeter demarked by edges A, B, C, D. Because edges A, B are parallel, edges C, D are parallel, and lines 104 form a cross-grating orthogonal to that of lines 103, via 161 has a substantially square footprint within cell 101. Via 161 passes through a line 103 of a first color (e.g., dielectric material stripe 110) to land on line 105A. Trace 151 is further coupled to lines 105B and 105C by way of additional vias 162 and 163, respectively. Notably, vias 162 and 163 are adjacent to each other, each passing through a line 103 having a same color (e.g., dielectric material stripe 115).

Top and sectional views of dielectric plug 130, via 161, via 162 and via 163 are all further illustrated in perspective by FIG. 1B. In FIG. 1B, the section of cell 101 is taken along the D line shown in FIG. 1A. As further shown in dashed line, via 161 comprises a stepped z-dimension profile. An upper via portion 161A having a rectangular footprint passes through a portion of ILD 125 with first lateral x-y dimensions defined by edges A, B, C, D. A lower via portion 161B having a rectangular (e.g., square) footprint has an x dimension reduced from upper via portion 161A to occupy only the space between adjacent material stripes 120. Within lower via portion 161B, the y-dimension is defined by edges C, D as stripes 120 extend beyond edges C, D. As such, the size of the upper and lower via portions 161A, 161B is equal to that of conductive trace 151 in the y-dimension. Vias 162 and 163 have a similar stepped z-dimension profile that includes upper and lower via portions. The lower via portions are again confined in the x dimension to the space between adjacent material stripes 120.

Notably, vias 162 and 163 also include upper portions that are separated from each other by a dielectric residue 135. Dielectric residue 135 has the same composition as ILD material 125, and as such, would be etched away during the patterning of vias 162 and 163 unless otherwise masked. As such, there may be no compositional basis for a selective etch to have resulted in the retention of residue 135. Hence, while the confinement of lower via portion 161B within material stripes 120 is indicative of an etch process that removed material stripe 115 selectively from material stripes 120, a mask is needed to confine the upper portions of via 162 and 163 from joining together into a single via. As will become clear in the discussion below, residue 135 is a consequence of the process employed to fabricate vias 162, 163. For some further embodiments also represented by FIG. 1B, the lateral dimension of the upper portions of vias 162, 163 (e.g., x-dimension) is larger than the space between them occupied by residue 135. In other words the x-dimension of residue 135 is smaller than the x-dimension of upper portions of vias 162, 163.

In some embodiments, dielectric plug 130 has the same footprint (area in x-y dimensions) of an upper portion of at least one of via 161, via 162 and via 163. According to some further embodiments herein, at least vias extending through the same ILD stripe material that is disposed below the plug, have the same lateral dimensions as the plug. For example, as depicted in FIG. 1B, dielectric plug 130 and vias 161, 162 and 163 all have the same y-dimension determined by the space between stripes of ILD material 125. Dielectric plug 130 and at least via 161 further have the same x-dimension as both are determined by a same grating mask having a fixed pitch. Hence $CD_1$ and $CD_2$ are substantially equal (within the tolerance of features formed by a single mask). While the y-dimension of vias 162, 163 may also be substantially equal to $CD_1$, they need not be. Vias 162, 163 are spaced apart from via plug 130 by a different pitch multiple than is via 161. For example, in reference to the tri-color dielectric layer including dielectric stripes 110, 115, and 120, it can be seen that both plug 130 and via 161 are substantially aligned over dielectric stripes 110. Vias 162, 163 however are aligned over dielectric stripes 115. A mask that opens vias 162, 163 may therefore be different than the mask that opens via 161 (and plug 130). As such, the lateral CD (e.g., x-dimension) of vias 162 and 163 may be different than those of via 161 and plug 130.

Figure 2A:
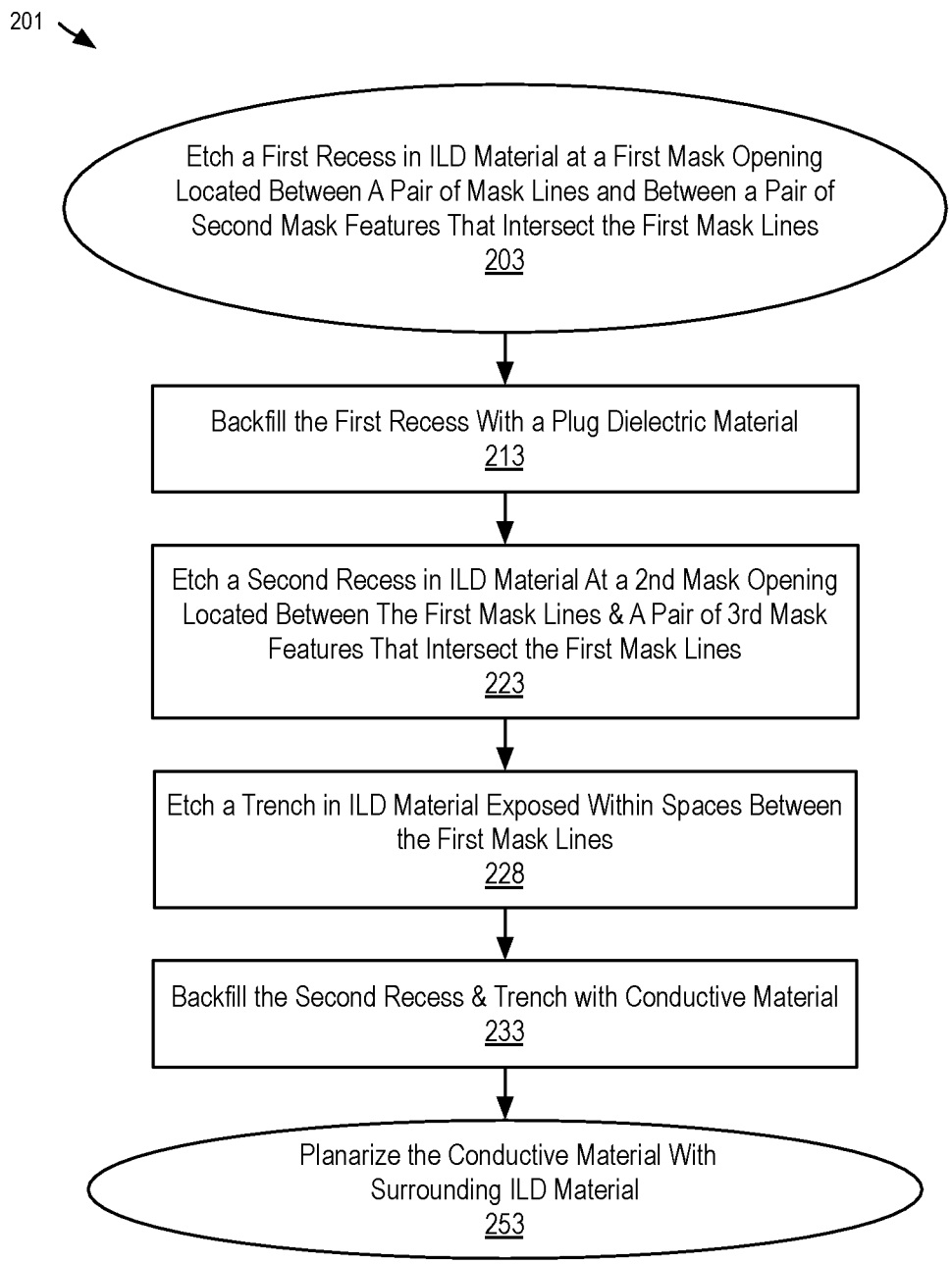
FIG. 2A is flow diagram illustrating via and plug formation, in accordance with some embodiments.

FIG. 2A is flow diagram illustrating methods 201 for via and plug formation, in accordance with some embodiments. Methods 201 begin at operation 203 where a first recess or opening in an ILD material is etched. The ILD is recessed at a first mask opening located between a pair of mask lines extending lengthwise in a first direction over a substrate, and between a pair of second mask features that intersect the first mask lines. The second mask features may backfill a space between the first mask lines. An exposed portion of ILD material between the pairs of mask lines and the pair of mask features may be etched with any suitable etch process, such as an anisotropic dielectric etch process. The recess etch may remove a first ILD material, stopping on an underlying ILD material.

At operation 213, the first recess is backfilled with a plug dielectric material having a different composition than that of the first ILD material, thereby forming a plug confined to the geometry of the recess. At operation 223, a second recess is etched into ILD material at a second mask opening. This second recess is to form a via opening exposing an underlying electrical contact point, such as an underlying conductive trace. The second recess is formed at a second mask opening located between the first mask lines and a pair of third mask features that intersect the first mask lines. The third mask features backfill a space between the first mask lines. In some embodiments, the second mask opening is substantially the same size as the first mask opening, for example both having been formed from a patterning process that was based on the same lithographic reticle. During the second recess etch, the plug dielectric may be protected by overlying mask material.

At operation 228, ILD material disposed within the space between the first mask lines is etched, for example after the second and third mask features have been removed. The trench etch process may include removing the first ILD material, leaving the plug dielectric and the ILD material that was under the first ILD material. The trench etch process may further recess the ILD material, concurrently recessing the plug dielectric material and thereby translating the plug shape into the underlying ILD material.

At operation 233, the second recess and the trench is backfilled with conductive material (e.g., Cu or other metal) to form an upper-level conductive trace confined to the space between the first mask lines and in contact with the lower-level conductive trace through the backfilled via opening. Methods 201 then complete at operation 253 where the conductive material is planarized with the surrounding ILD material, for example by chemical mechanical polish (CMP). This planarization may remove the first mask lines. This planarization may also expose ILD material at the location of the plug, thereby defining an end of the upper-level trace. With first lateral dimensions of the plug and the via being substantially the same, adjacent upper level traces are separated by ILD material at the plug location by a lateral distance that is substantially equal to the lateral distance of the via. Second lateral dimensions of the plug and the via are substantially equal to that of the trench because all three features are defined by the same first mask lines. Depending on the alignment of lower-level conductive traces, the method 201 may include additional via etches that employ different mask features to locate vias as needed. For each via etch, masking material may be backfilled into previously formed via openings and repatterned using one or more additional lithographic reticle.

Figure 2B:
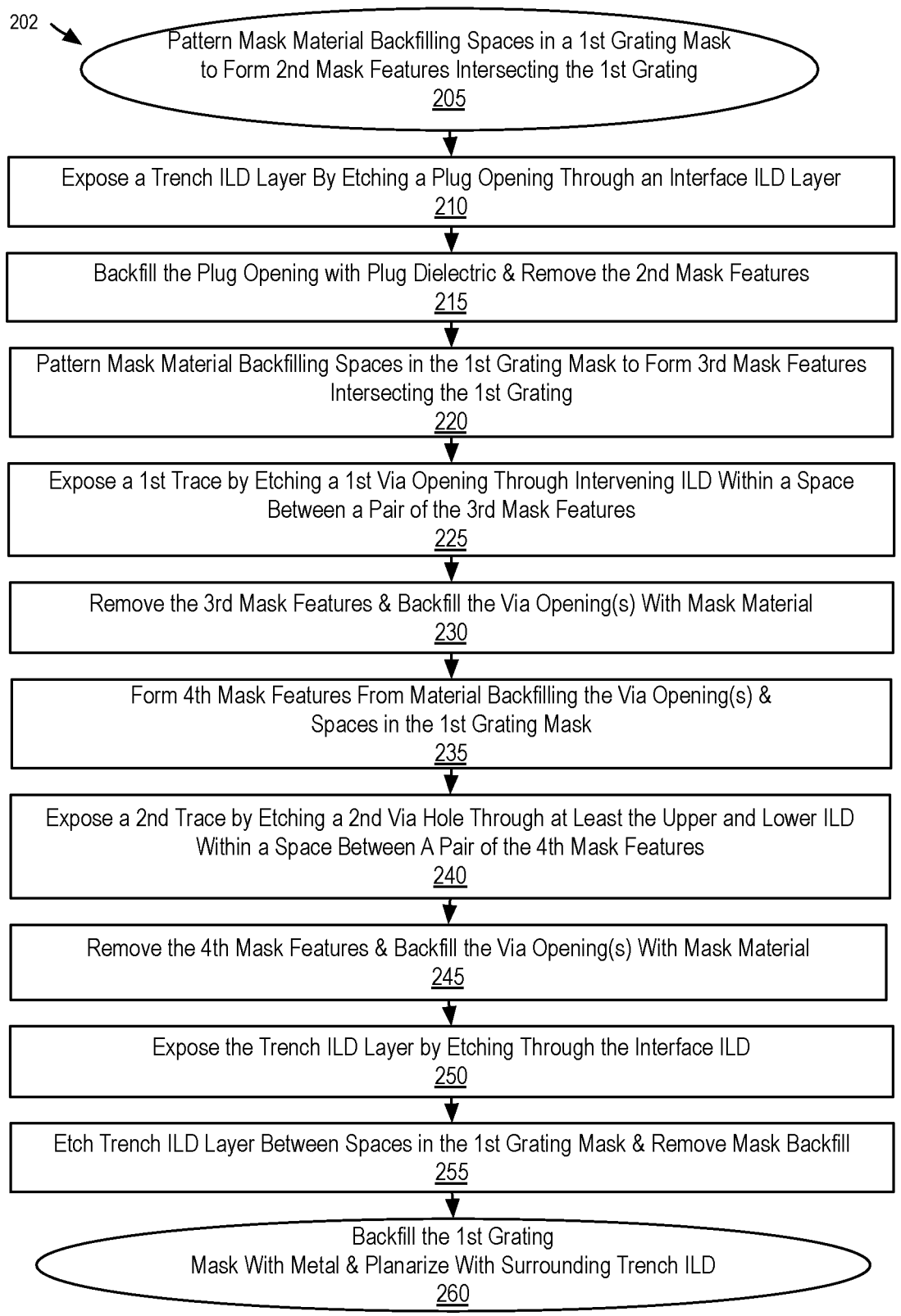
FIG. 2B is flow diagram illustrating via and plug formation over a multi-colored grating, in accordance with some embodiments of the methods illustrated in FIG. 2A.

FIG. 2B is a flow diagram illustrating methods 202 for fabricating self-aligned via and plug formation over a multi-colored grating, in accordance with some embodiments of methods 201. FIG. 3-23 illustrate perspective cross-sectional views of an interconnect structure after selected operations of the methods 202 are performed, in accordance with some embodiments.

Referring first to FIG. 2B, methods 202 begin at operation 205 where a workpiece with a multi-layered mask stack including a first grating mask is received. The substrate may be any known IC substrate as embodiments herein are not limited in this respect. In some examples, the substrate received at operation 205 is a semiconductor wafer including a plurality of active device structures fabricated upstream of methods 202. For example, the substrate received may include a plurality of FETs (e.g., silicon CMOS FETS) fabricated in one or more substrate layers. A cross-grating mask is employed to form mask features in plane with the first grating mask. A first mask layer, as received at operation 205, has been patterned into a first grating mask extending lengthwise in a direction, for example orthogonal to longitudinal lengths of underlying features that are to be connected by a via. Any known technique may then be employed to form second mask features in material backfilling spaces within the first grating mask. For example, an initial grating mask pattern may be printed with a pitch P' and then modified through a pitch splitting process (e.g., pitch halving or pitch quartering) to form the first grating mask including first parallel masking lines. Another grating mask pattern may be printed with a pitch P in a direction orthogonal to the first grating mask, and then modified through a pitch splitting process (e.g., a pitch halving or quartering process) to form the second grating mask which is then translated through etch into material that is backfilling spaces within the first grating mask.

Figure 3:
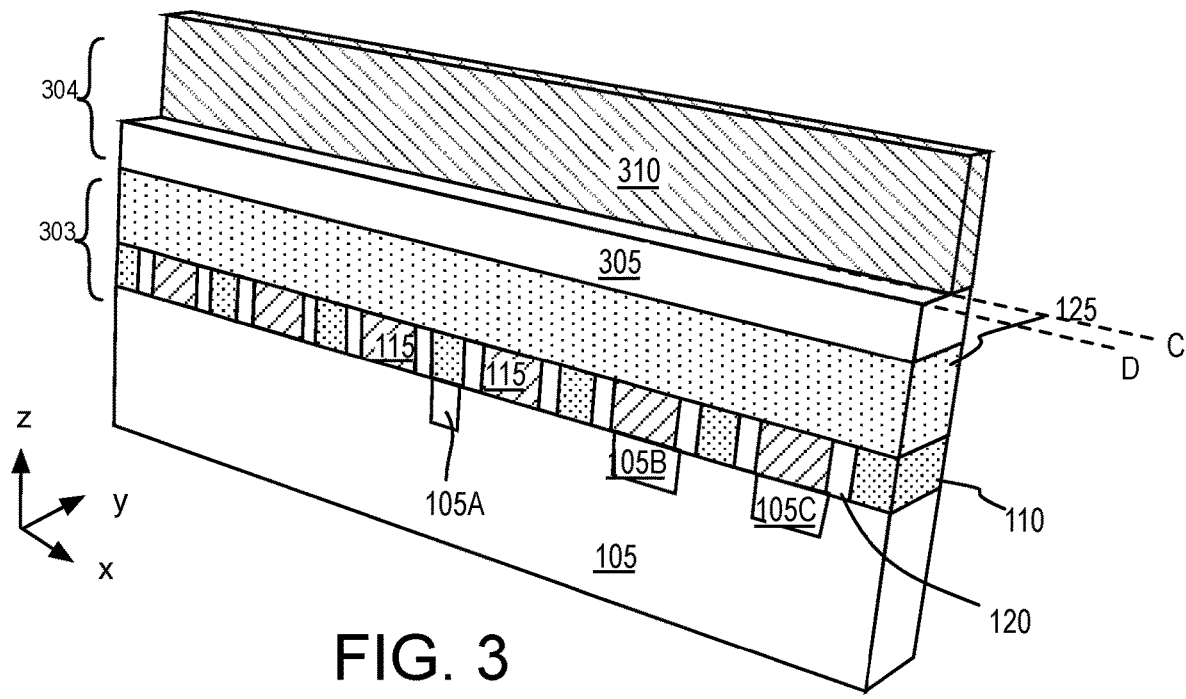
FIGS. 3, 4, 5, 6, 7, 8, 9, 10, 11, 12, 13, 14, 15, 16, 17, 18, 19, 20, 21, 22, and 23 are perspective cross-sectional views of an interconnect structure after selected operations in the methods illustrated in FIG. 2B are performed, in accordance with some embodiments.

In some embodiments illustrated further by FIG. 3, a received workpiece includes a base layer 105, which may include any number of material layers and patterned features. Exemplary patterned features in base layer 105 include lower-level lines 105A, 105B, 105C, substantially as introduced above. ILD stack 303 is disposed over base layer 105. ILD stack 303 includes a multi-colored layer comprising dielectric stripes 110, 115, 120, and a trench dielectric layer 125 disposed over dielectric stripes 110, 115, 120. Trench dielectric layer 125 may be of any material composition known to be suitable for insulating conductive traces in an IC, as embodiments herein are not limited in this respect. In some examples, trench dielectric layer 125 is SiO or SiOC. However, trench dielectric layer 125 may alternatively be one of SiC, SiN, SiCN, HSQ, MSQ, or the like. Various light and transition metal oxides (e.g., $AlO_X$, $HfO_X$, $ZrO_X$, $TiO_X$), silicates or nitrides are also possible. Trench dielectric layer 125 may have any thickness. In some embodiments, the thickness of trench dielectric layer 125 is selected to provide a metal trace of a desired z-thickness as well as a via of desired z-height.

Multi-layered (hard)mask 304 is disposed over ILD stack 303. Multi-layered mask 304 includes a base ILD 305 disposed on ILD stack 303 and first grating mask disposed over base ILD 305. As shown in FIG. 3, the first grating mask comprises a first mask stripe or line 310 extending lengthwise along the dashed C line in a direction orthogonal to dielectric stripes 110, 115, 120. A second such mask line (not depicted) extends lengthwise along the parallel dashed D line. Interface ILD 305 is exposed within spaces between pairs of the first mask lines 310. Interface ILD 305 may be of any material composition distinct from that of trench dielectric layer 125. In some examples, interface ILD 305 is SiN or SiNC. However, interface ILD 305 may alternatively be one of SiC, SiO, SiOC, HSQ, MSQ, or the like. Various light and transition metal oxides (e.g., $AlO_X$, $HfO_X$, $ZrO_X$, $TiO_X$), silicates or nitrides are also possible. First mask lines 310 may have any material composition. In some embodiments, mask lines 310 comprise a dielectric having a composition distinct from that of interface ILD 305. In some examples, mask lines 310 are SiC, Si, or Ge. In some further embodiments, the material layers of ILD stack 303 and multi-layered mask 304 are all formed by chemical vapor deposition (CVD), atomic layer deposition (ALD), or the like. Critical dimensions of mask lines 310 may vary with technology node. In some embodiments, mask lines 310 have approximately 60 nanometer pitch, or less.

Figure 4:
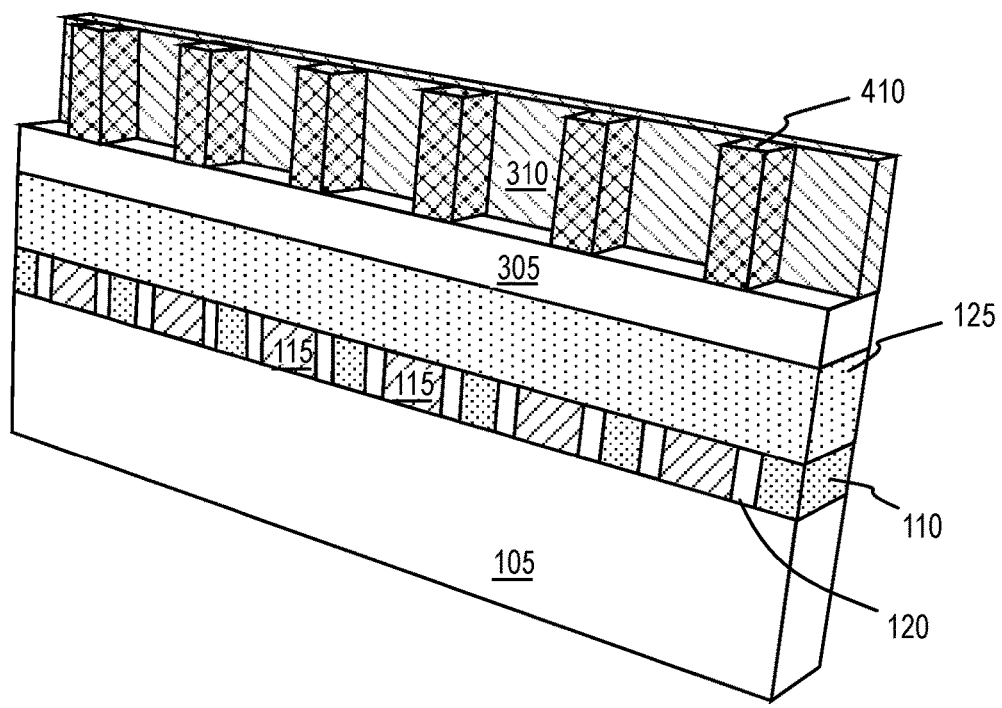
Figure 5:
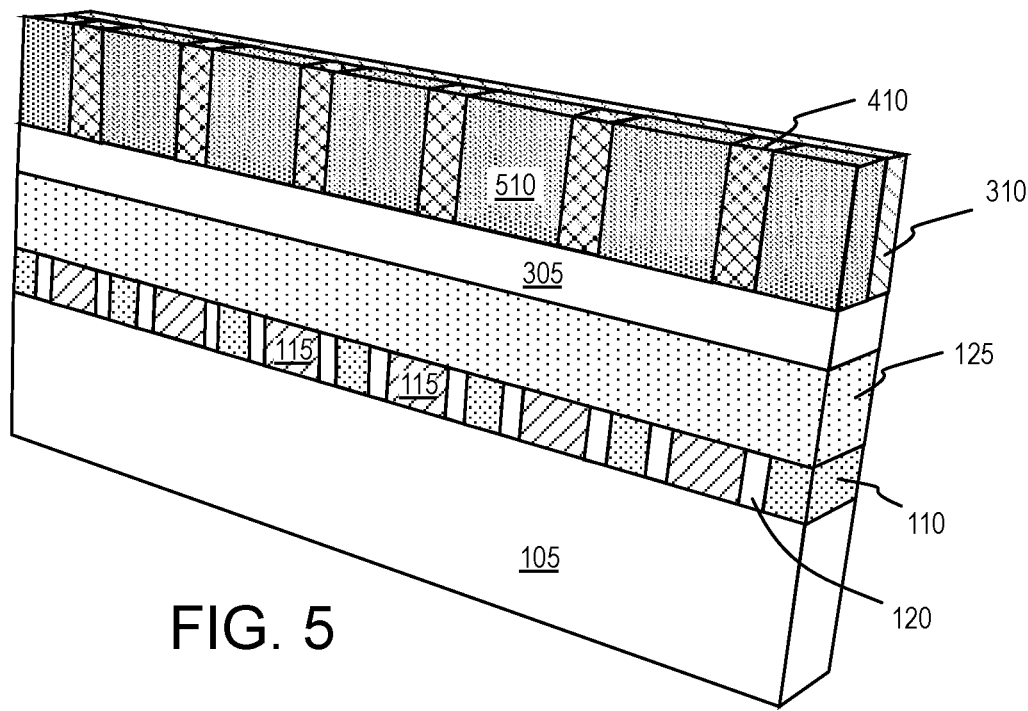

As further illustrated in FIG. 4, intersecting second mask features 410 are formed from material backfilled in spaces between mask lines 310. In some examples, mask features 410 are of a carbonaceous material, such as, but not limited to, DLC, Si-DLC, or any other known carbon-hardmask (CHM) composition. However, mask features 410 may alternatively be one of SiC, SiO, SiOC, HSQ, MSQ, or the like. Various light and transition metal oxides (e.g., $AlO_X$, $HfO_X$, $ZrO_X$, $TiO_X$), silicates or nitrides are also possible. Mask features 410 are disposed over a first material of the multi-colored ILD layer. As shown in FIG. 4, mask features 410 are disposed over dielectric stripes 115 and spaces between mask features 410 are disposed over dielectric stripes 110. Critical dimensions of mask features 410 may also vary with technology node. In some embodiments mask features 410 have approximately 60 nanometer pitch, or less. Notably, in the illustrated example, mask features 410 are smaller than half their pitch. Mask features 410 may be formed by lithographical imaging a photosensitive layer with a grating pattern at a pitch P, which is reduced through a pitch halving (or pitch quartering) patterning process, for example. The scaled grating pattern is then translated by etch into the mask material that backfills grating mask 310. As will be discussed further below, the dimensions of the space between a pair of adjacent mask lines 310, and a pair of adjacent mask features 410 dictate the lateral dimensions of dielectric plugs separating adjacent conductor line ends. The dimensions of the spaces between mask lines 310 and between mask features 410 may further dictate the lateral dimensions of at least a portion of one conductive via.

Returning to FIG. 2B, methods 202 continue at operation 210, where the trench ILD layer is exposed by etching a first opening or recess through the interface ILD layer. As will be discussed further below, the location of these first recesses determine the location of the dielectric plugs between conductor line ends. The recesses may be formed by any subtractive process, such as but not limited to an anisotropic dielectric etch. This etch may be selective relative to the trench ILD layer so that the etch can stop on the trench ILD layer. The location of the recess is defined by the spacing between a pair of mask lines and a pair of second mask features that intersect with the pair of mask lines. Orthogonally crossed grating masks define a plurality of openings at each spacing intersection, and in accordance with some embodiments the etching operation 210 only removes the interface ILD layer from a subset of these openings (otherwise there would be plugs at every intersection).

Figure 6:
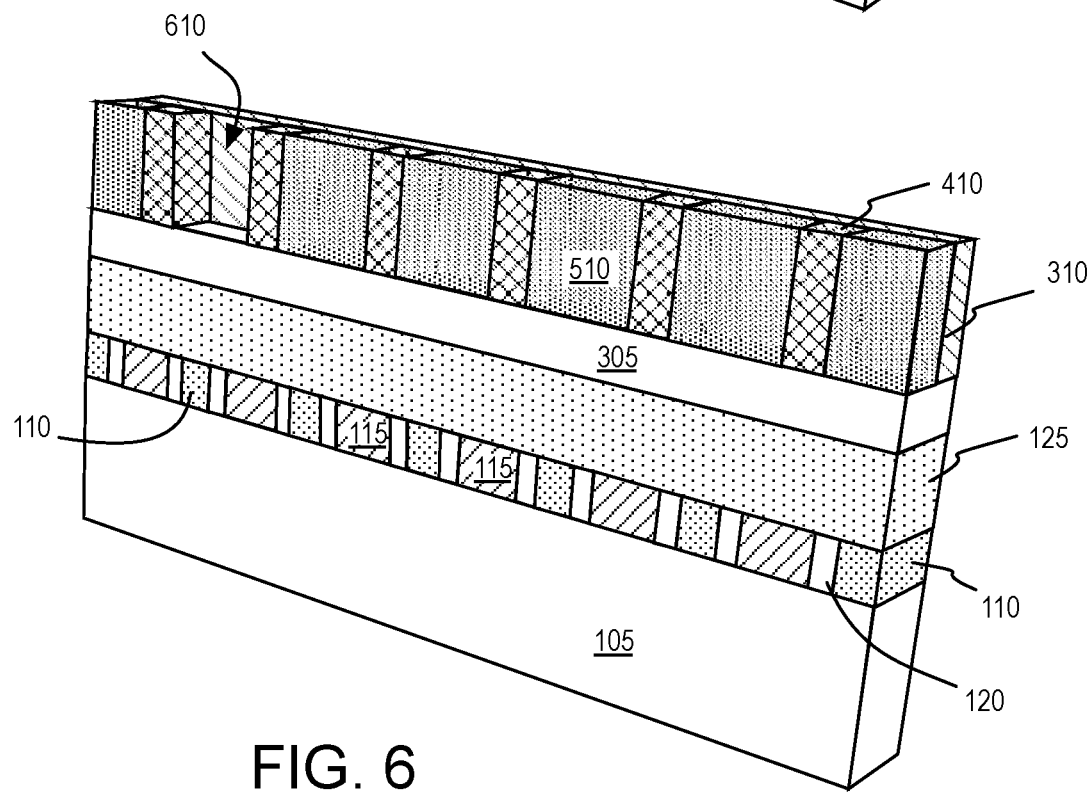
Figure 7:
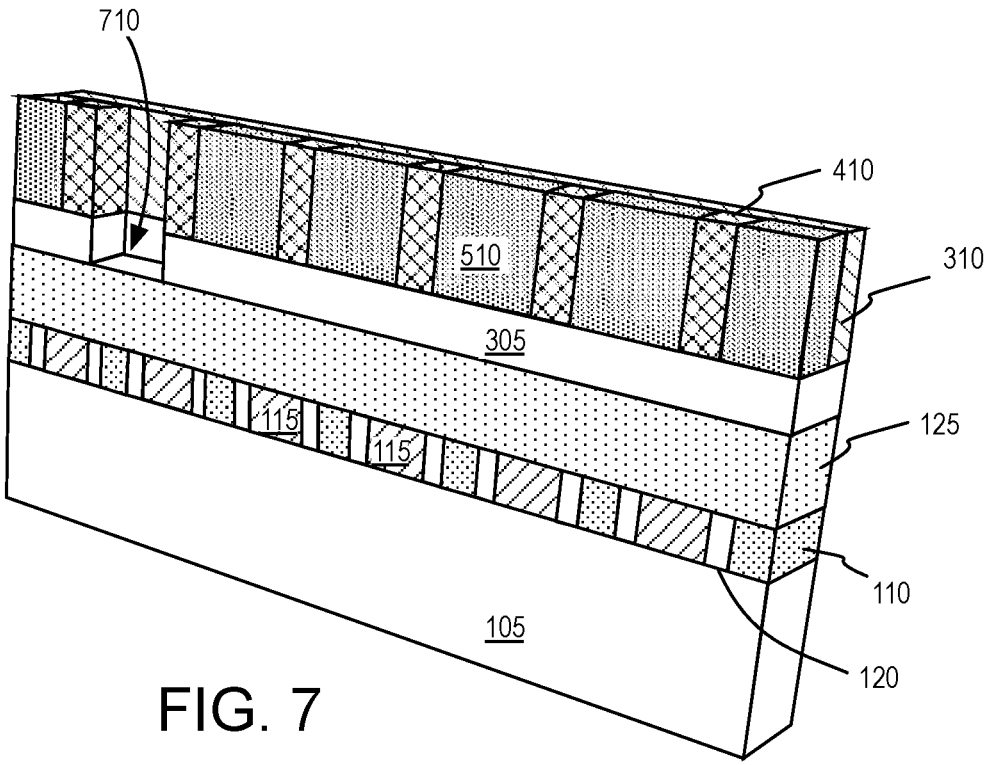

Removal of the interface ILD may be made selective to a subset of the grating openings with any known technique. In some exemplary embodiments, a mask material is backfilled within all openings defined by the crossed grating masks, and then a subset of the backfilled regions is opened where the anisotropic etch will subsequently remove the interface ILD. One example of this technique is further illustrated in FIG. 5, which shows spaces between masking features 410 (and between mask lines 310) are backfilled with mask backfill material 510. The top surface of mask backfill material 510 is substantially planar with a top surface of mask lines 310 and mask features 410. In some advantageous embodiments, mask backfill material 510 is photosensitive (e.g., photoresist). At this point, the plurality of openings defined by mask lines 310 and second mask features 410 may be considered individual buckets filled with mask backfill material 510. FIG. 6 further illustrates selective removal of mask backfill material 510. For embodiments where mask backfill material 510 is photoresist, a lithographic process (exposure and develop) forms opening 610 uncovering interface ILD 305. Any lithographic process, such as, but not limited to, 193 nm immersion lithography may be employed to form opening 610. FIG. 7 further illustrates selective removal of interface ILD 305, landing on trench ILD 125. Any anisotropic etch (e.g., plasma dielectric etch) known to be suitable for the compositions of ILDs 305, 125 may be employed to form ILD opening (recess) 710.

Returning to FIG. 2B, methods 202 continue at operation 215 where the opening(s) formed in the upper ILD layer is(are) backfilled with another ILD material. This backfilling is to be performed while the backfilled grating masks are present such that the dielectric backfill material is deposited only where the lower ILD material was removed at operation 210. While the composition of the ILD material enlisted to backfill the etched opening may vary, in some exemplary embodiments, the ILD material backfilled at operation 215 has the same composition as that of the trench ILD material exposed during the etching operation 210.

Figure 8:
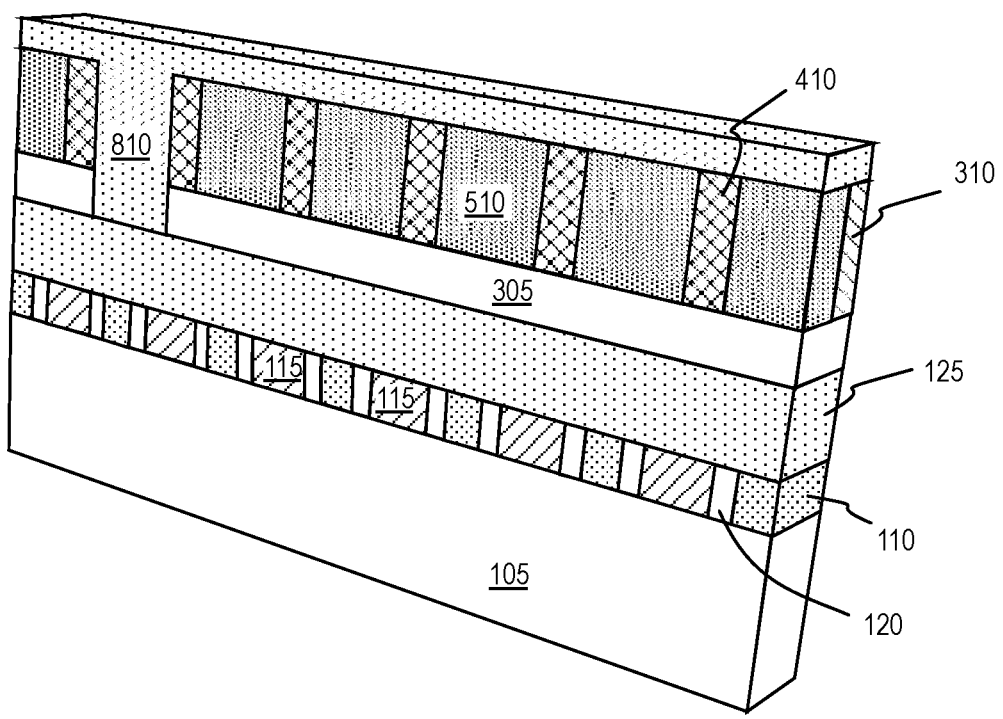
Figure 9:
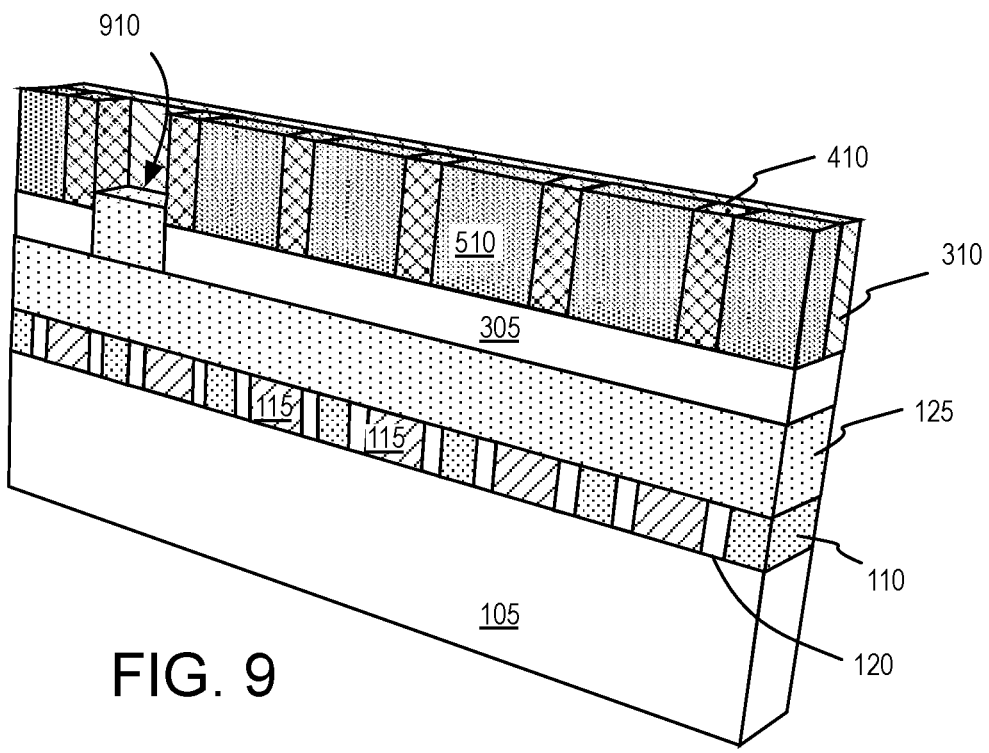
Figure 10:
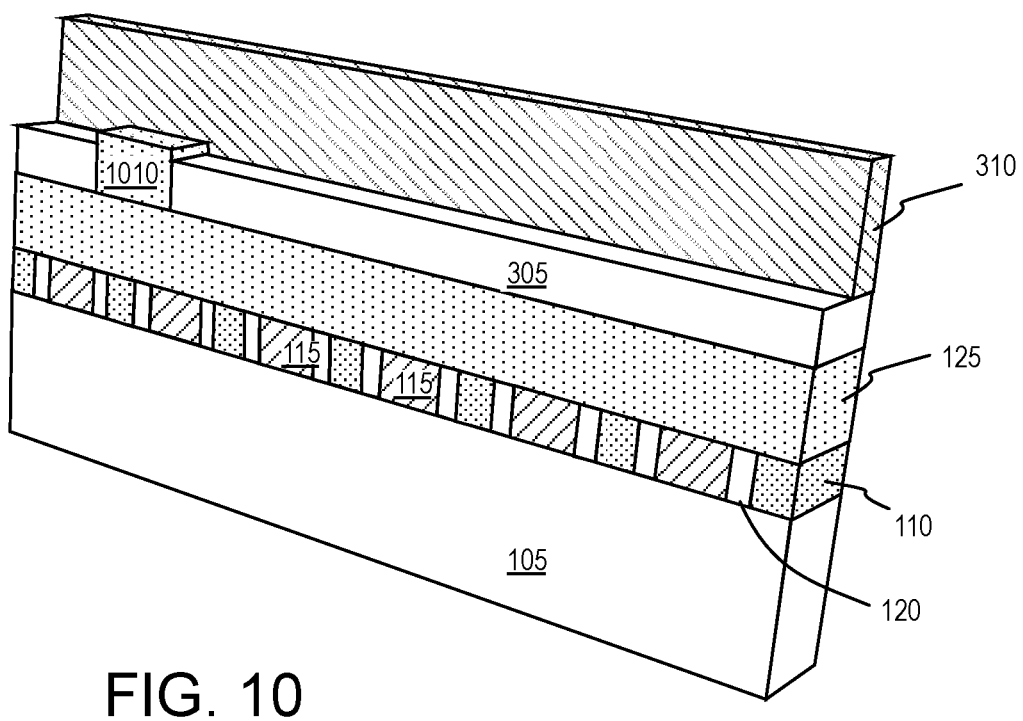

An example of the structures present after operation 215 is further illustrated in FIG. 8. As shown, plug dielectric 810 has been deposited over the workpiece, filling opening 710 with some overburden present over the top surface of mask lines 310 and second mask features 410, as well as grating backfill 510. In FIG. 8, plug dielectric 810 is shaded to match trench ILD 125 as an indication that the two materials have the same composition in this exemplary embodiment. A line is illustrated between plug dielectric 810 and trench ILD 125 for the sake of retaining the backfill interface for reference. This interface may also remain in the final device structure, although it need not as noted below. FIGS. 9 and 10 further illustrate the completion of operation 215. As shown in FIG. 9, plug dielectric 810 is recess etched to remove overburden and form post recess 910. A blanket etch (wet or dry) may be employed to remove the overburden and expose mask lines 310, and mask features 410, as well as the mask backfill material 510. This recess etch may be stopped at any point prior to re-exposing trench ILD 125. As further shown in FIG. 10, mask backfill material 510 and mask features 410 are then stripped (e.g., ashed where they are both carbon-based). Dielectric post 1010 is present where a dielectric plug is to be formed. Notably, mask lines 310 are retained, so removal of mask backfill material 510 and mask features 410 should be selective relative to mask lines 310. Compositions of these materials may be chosen in further view of this constraint.

Returning to FIG. 2B, methods 202 continue at operation 220 where another grating mask crossing the first grating mask is employed to form third mask features. Any known technique may be employed to form these third mask features, for example from material backfilling spaces between pairs of the first mask lines. A pitch-splitting (e.g., pitch halving or quartering) process may be employed to form the third mask features from a grating reticle lithographically imaged at pitch P. As described further below, the intersection of the first grating mask and third mask features again defines a plurality (e.g., grid) of openings, a subset of which will locate first conductive vias. For this subset, an underlying conductive trace is exposed by etching via holes through the intervening ILD at operation 225. In exemplary embodiments, the via etch at operation 225 entails an anisotropic etch through at least a trench ILD layer.

In some exemplary embodiments, a material is backfilled within all openings defined by the grating mask and the intersecting mask features. A subset of the backfilled regions are then opened, which is where an anisotropic via etch will then remove the underlying ILD material. One example of this technique is further illustrated in FIG. 11, where third mask features 1110 are shown to be backfilled with mask backfill material 1120. Third mask features 1110 may be formed from material backfilled in spaces between first mask lines 310, for example substantially as described from second mask features 410. In some examples, mask features 1110 are a carbonaceous material, such as, but not limited to DLC, Si-DLC, or any other known CHM composition. However, mask features 1110 may alternatively be one of SiC, SiO, SiOC, HSQ, MSQ, or the like. Various light and transition metal oxides (e.g., $AlO_X$, $HfO_X$, $ZrO_X$, $TiO_X$), silicates or nitrides are also possible.

Mask features 1110 are disposed over a second material of the multi-colored ILD layer. As further shown in FIG. 11, mask features 1110 are disposed over dielectric stripes 110 and spaces between mask features 1110 are disposed over dielectric stripes 115. Critical dimensions of mask features 1110 may vary with technology node. In some embodiments mask features 1110 have approximately 60 nanometer pitch, or less. Notably, in the illustrated example, mask features 1110 are smaller than half their pitch. Such mask features may be formed from a lithographic plate or reticle that prints at a pitch P, which is then translated by etch into the material backfilling grating mask 310 following a pitch halving (or pitch quartering) patterning process, for example. In some exemplary embodiments, the a reticle printing at the same pitch as that employed at operation 205, but with features shifted laterally, is employed to form mask features 1110, for example with a P/2 process. As will be discussed further below, the dimensions of the spaces in between mask lines 310, and spaces between a pair of mask features 1110 dictate the lateral dimensions of one or more conductive vias extending between conductor lines on different interconnect levels.

Figure 11:
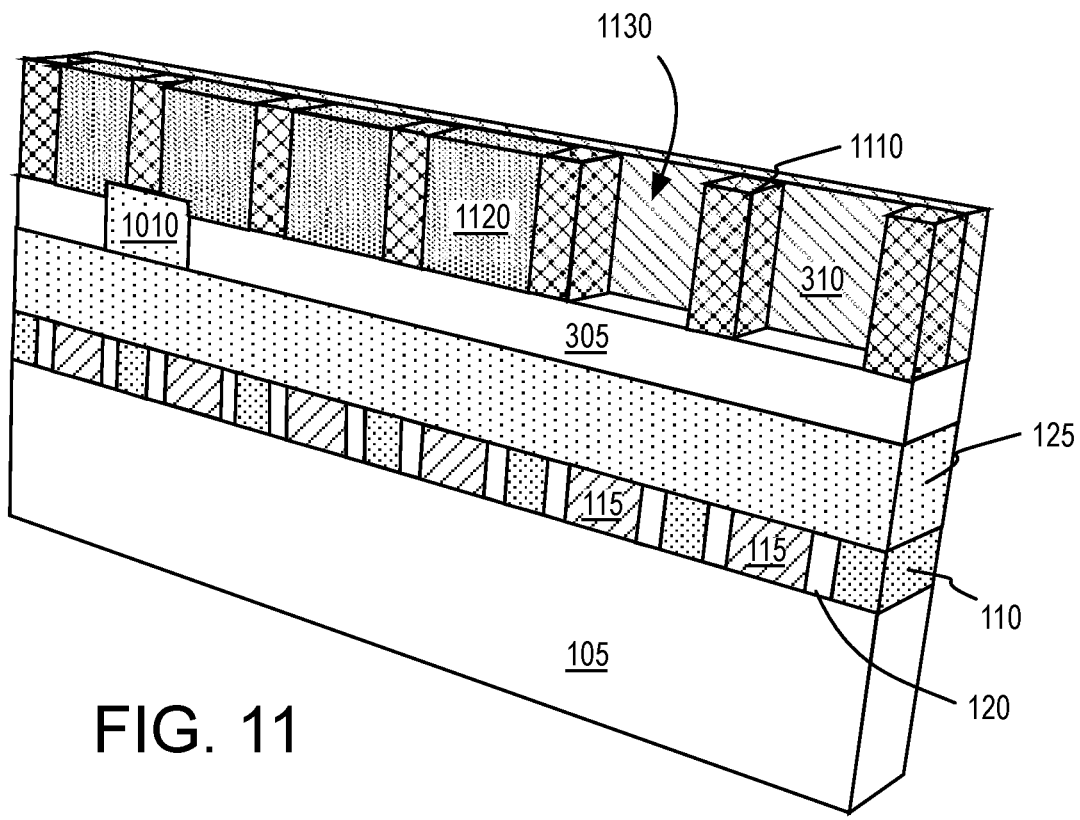
Figure 12:
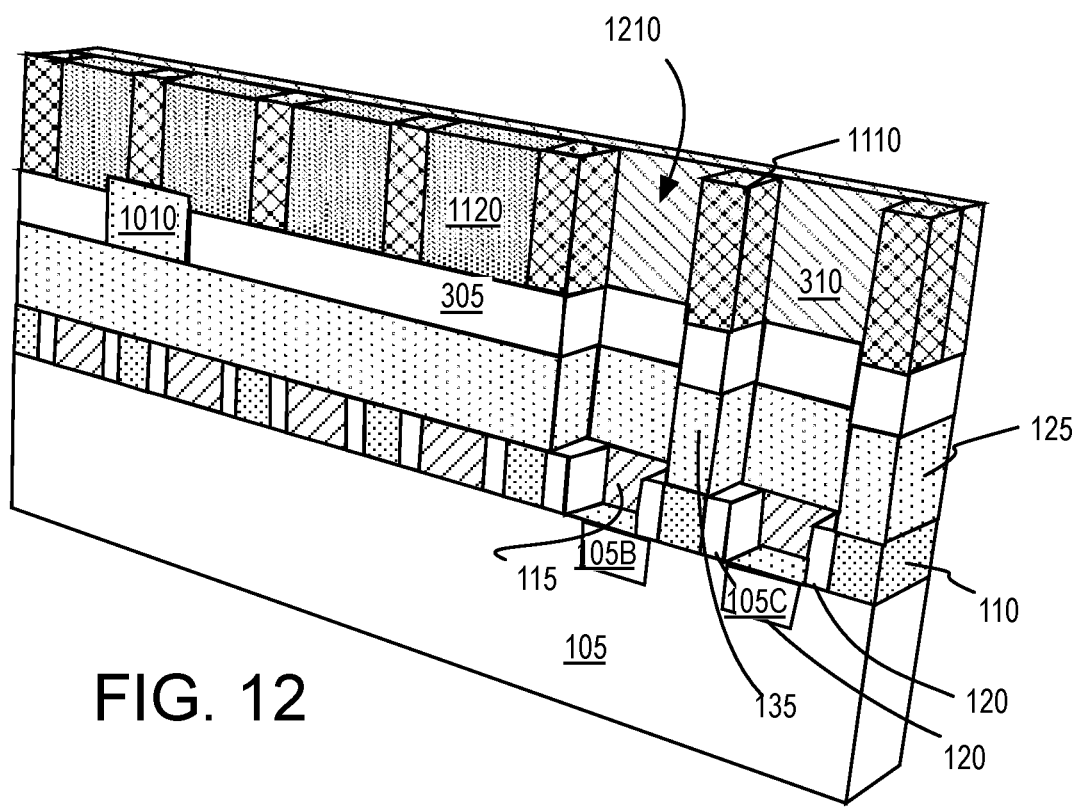
Figure 13:
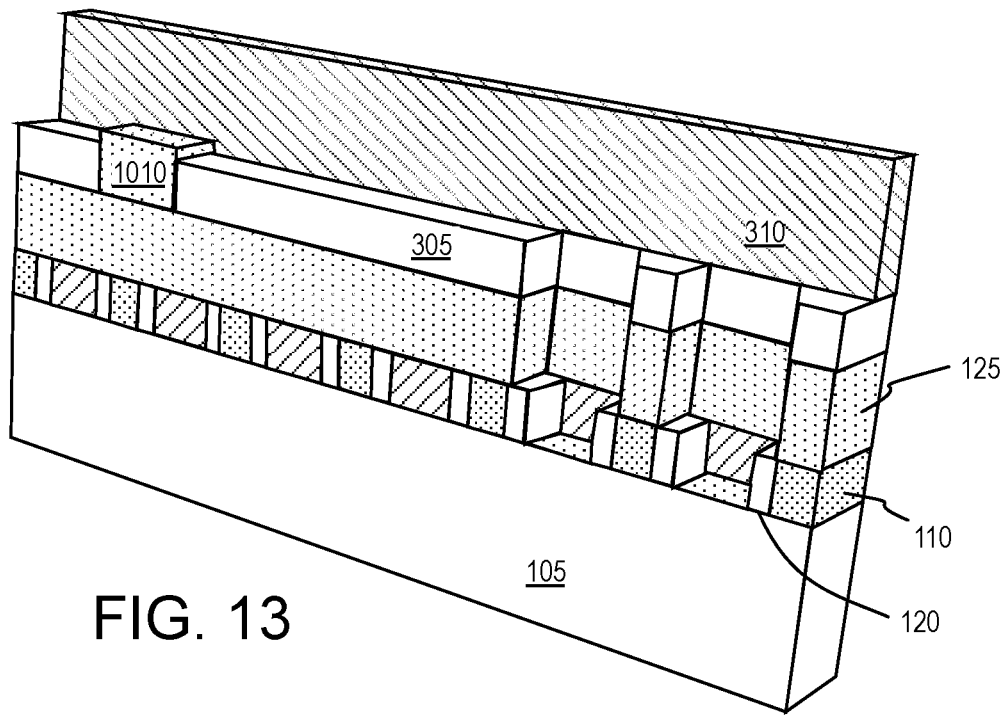

The top surface of mask backfill material 1120 is substantially planar with a top surface of mask lines 310 and mask features 1110. In some advantageous embodiments, mask backfill material 1120 is photosensitive (e.g., photoresist). FIG. 11 further illustrates selective removal of the mask backfill material 1120. For embodiments where mask backfill material 1120 is photoresist, a lithographic process (exposure and develop) produces opening(s) 1130 exposing interface ILD 305. Any lithographic process, such as, but not limited to, 193 nm immersion lithography may be employed to form opening(s) 1130. FIG. 12 further illustrates anisotropic removal of interface ILD 305, trench ILD material 125, and material stripe 115 with the opening sidewalls aligned to corresponding edges of mask lines 310, and mask features 1110. Via openings 1210 land on base material layer 105 (e.g., conductive lines 105B, 105C). Any anisotropic etch (e.g., plasma dielectric etch) known to be suitable for the compositions of ILDs 305, 125, and 115 may be employed to form via opening(s) 1210. Notably, FIG. 12 also illustrates definition of trench ILD residue 135, which is masked by one masking feature 1110. The via opening(s) 1210 therefore illustrate an example of pair of vias at the minimum pitch facilitated by mask lines 310 and mask features 1110.

Figure 14:
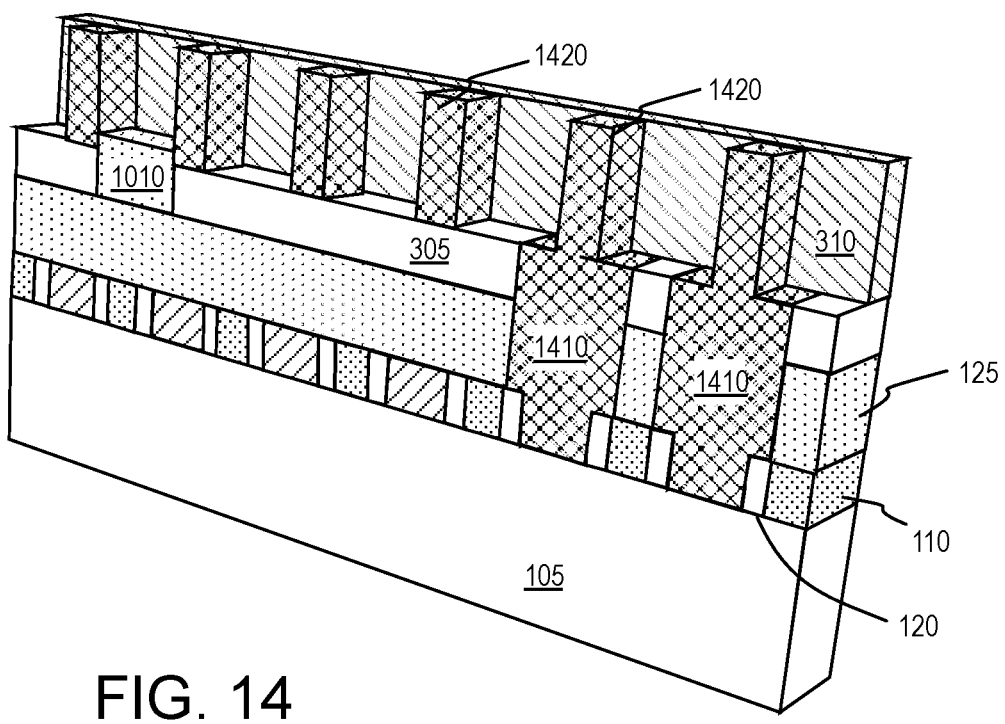

Returning to FIG. 2B, methods 202 continue at operation 230 where the third mask features are removed and the first via openings backfilled with mask backfill material. Mask feature removal may be selective, based on compositional differences, to retain the first mask lines. At operation 235, the backfilled mask material is patterned into fourth mask features substantially the same as those formed at operation 205. As such, via etch operation 240 may be considered to re-form the second mask features intersecting the first grating mask lines in substantially the same manner as described above. For example, FIG. 14 illustrates mask backfill material 1410 disposed in the via openings and backfilling the spaces between first mask lines 310. Mask backfill material 1410 has been further patterned into a mask features 1420 intersecting mask lines 310 orthogonally. In some examples, mask backfill material 1410 (mask feature 1420) is a carbonaceous material, such as, but not limited to DLC, Si-DLC, or any other known carbon-hardmask (CHM) composition. However, it may alternatively be one of SiC, SiO, SiOC, HSQ, MSQ, or the like. Various light and transition metal oxides (e.g., $AlO_X$, $HfO_X$, $ZrO_X$, $TiO_X$), silicates or nitrides are also possible.

As also shown in FIG. 14, mask features 1420 are disposed over dielectric material stripes 115, with spaces between features 1420 disposed over dielectric material stripes 110. Critical dimensions of mask features 1420 may vary with technology node. In some embodiments, mask features 1420 haves approximately 60 nanometer pitch, or less. In some embodiments, mask features 1420 have approximately the same feature dimensions and pitch as masking features 410. Notably, in the illustrated example, mask features 1420 are smaller than half their pitch. Such mask features may be formed with the same reticle employed at operation 205 and translated by etch into backfill material 1410 with a pitch halving (or pitch quartering) patterning process, for example. As will be discussed further below, the dimensions of the space between mask lines 310 and between mask features 1420 determine the lateral dimensions of second via openings.

Orthogonally crossed grating masks may define a plurality of openings at each spacing intersection, and in accordance with some embodiments the etching operation 240 only forms openings in the ILD layers at a subset of these openings. In some exemplary embodiments, a mask material is backfilled within all openings defined by the intersection of mask lines 310 and mask features 1420. A subset of the backfilled regions is then opened, and a subsequent anisotropic etch will remove ILD within the mask opening. One example of this technique is further illustrated in FIG. 15, which shows spaces between mask features 1420 is backfilled with mask backfill material 1510. The top surface of mask backfill material 1510 is substantially planar with a top surface of grating mask line(s) 310. In some advantageous embodiments, mask backfill material 1510 is photosensitive (e.g., photoresist).

Figure 15:
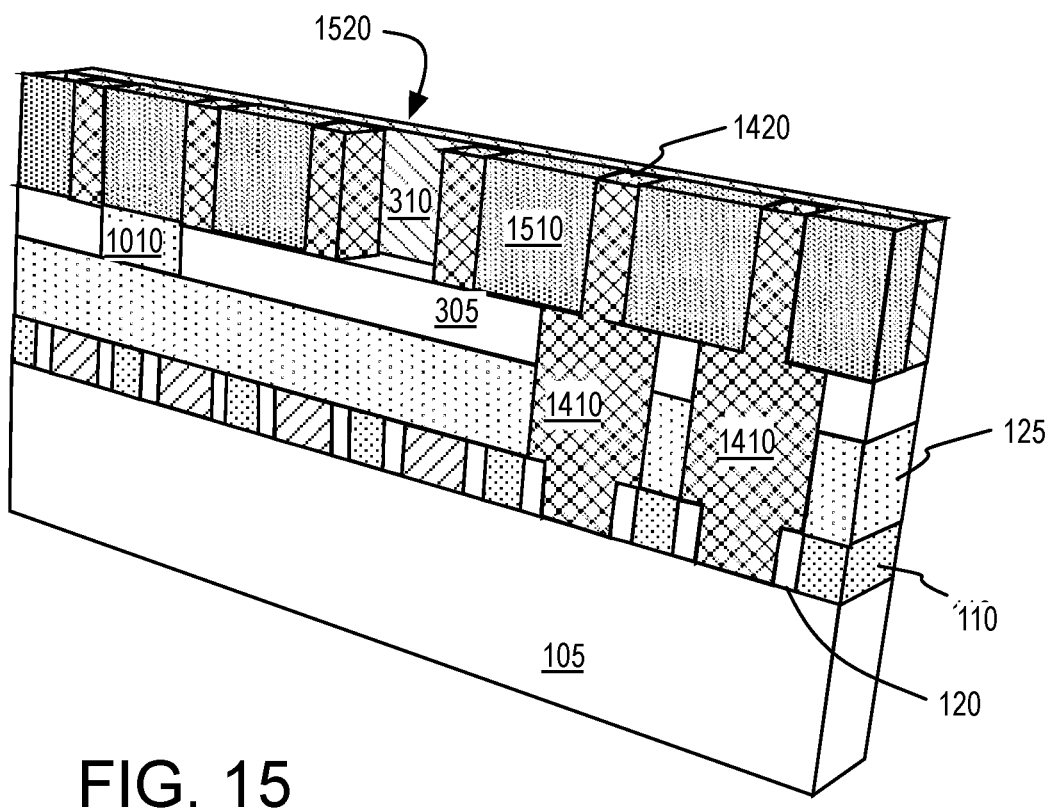
Figure 16:
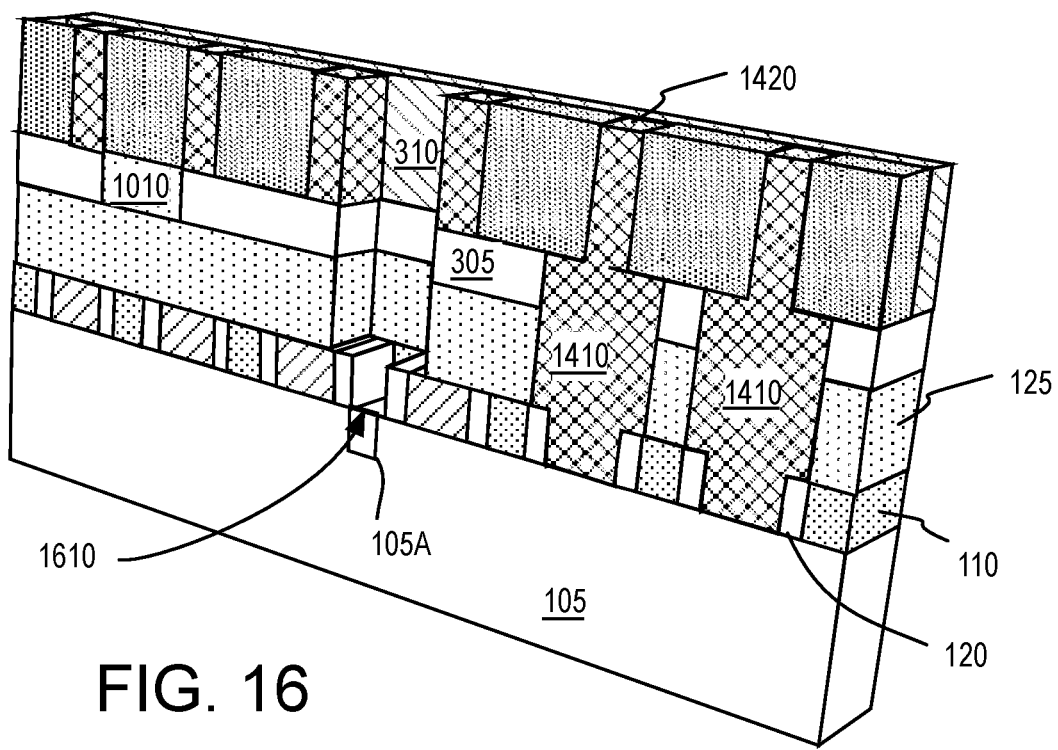

FIG. 15 further illustrates selective removal of the mask backfill material 1510. For embodiments where backfill material 1510 is photoresist, a lithographic process (exposure and develop) forms mask opening 1520 uncovering interface ILD material 305. Any lithographic process, such as, but not limited to, 193 nm immersion lithography may be employed to form mask opening 1520. FIG. 16 further illustrates anisotropic removal of interface ILD 305, trench ILD 125, and dielectric material stripe 110 with the opening sidewalls aligned to corresponding edges of masks lines 310 and mask features 1420. Via opening 1610 lands on base material layer 105 (e.g., conductive line 105A). Any anisotropic etch (e.g., plasma dielectric etch) known to be suitable for the compositions of ILDs 305, 125, and 115 may be employed to form via opening(s) 1610.

Figure 17:
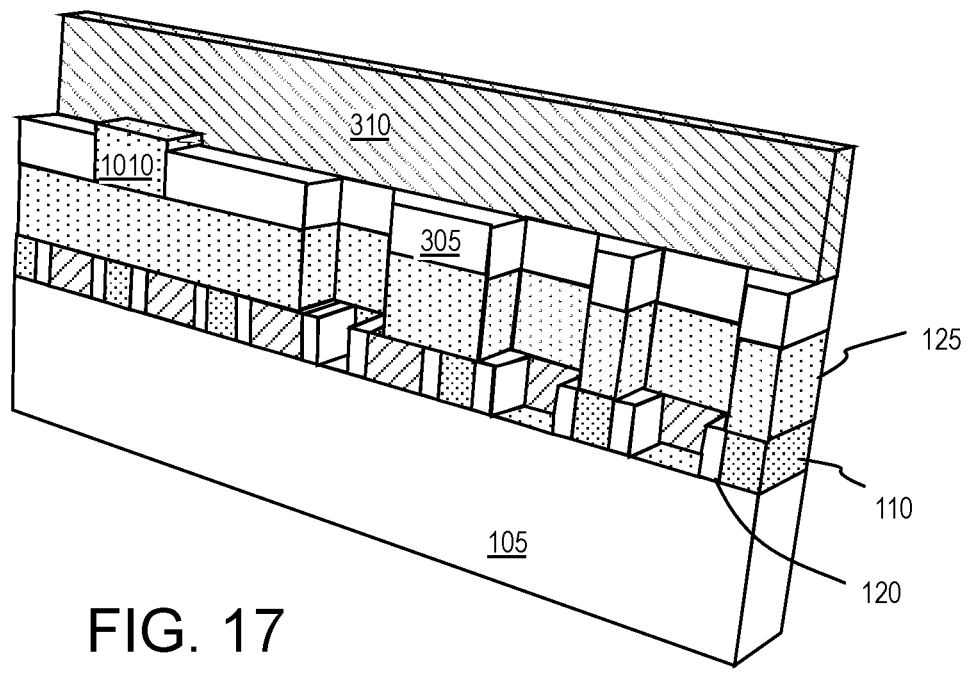
Figure 18:
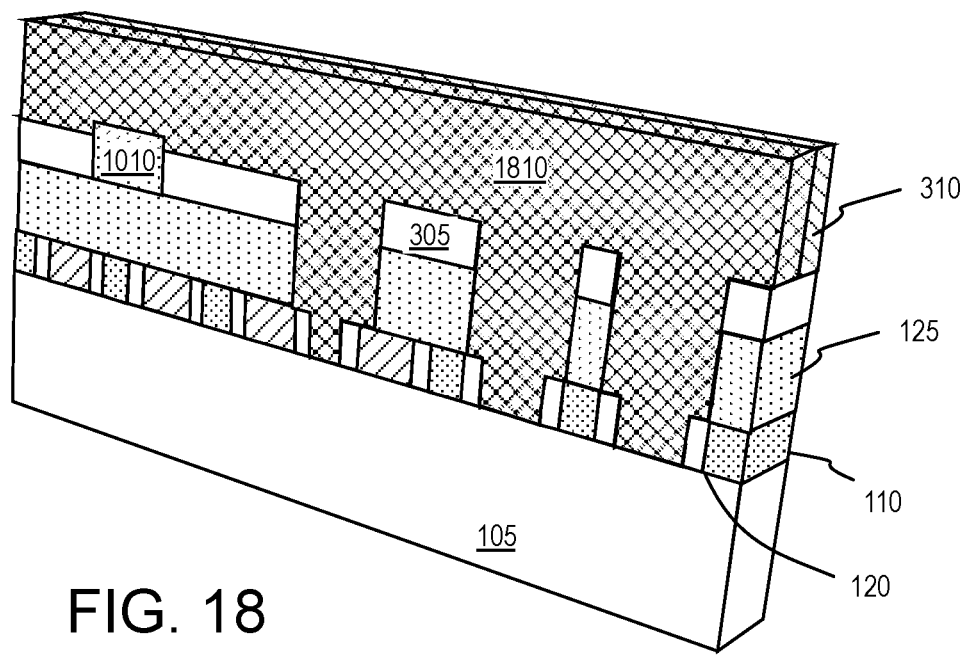
Figure 19:
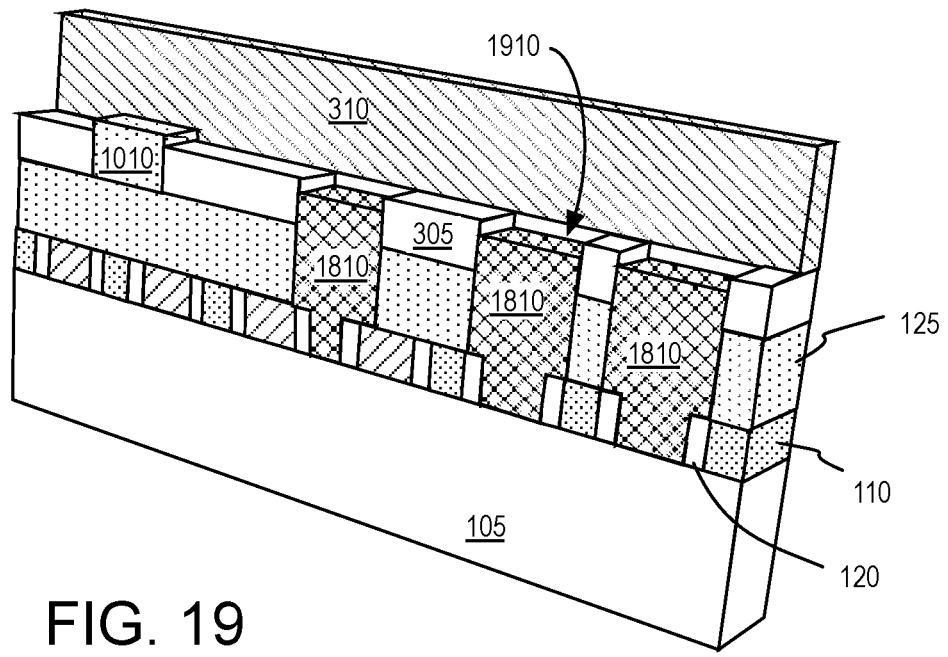
Figure 20:
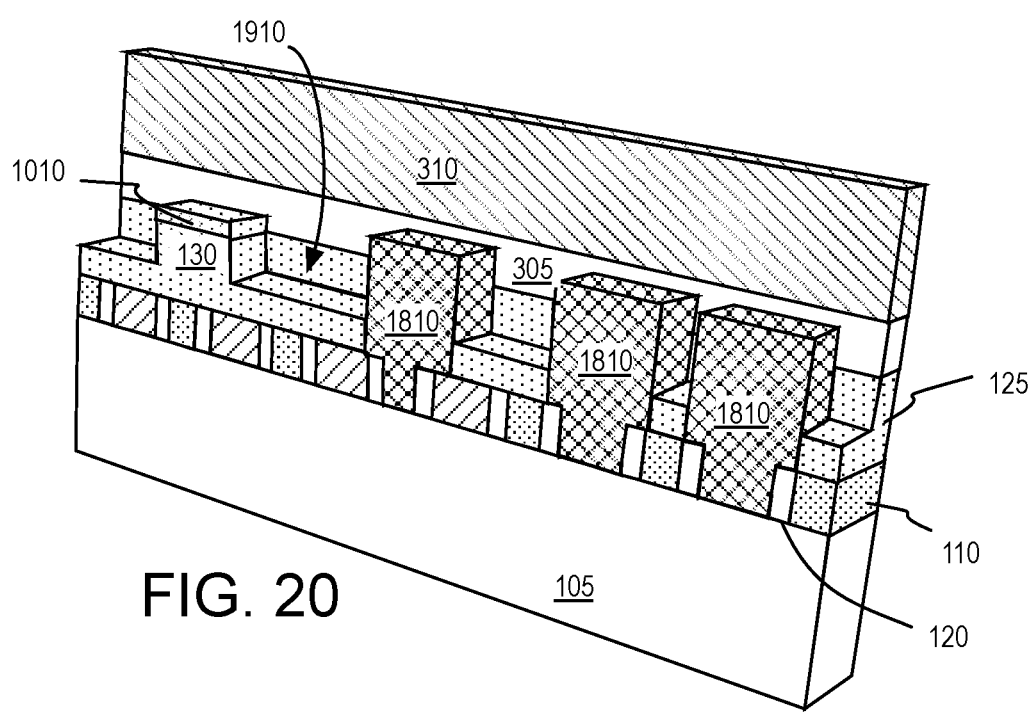
Figure 21:
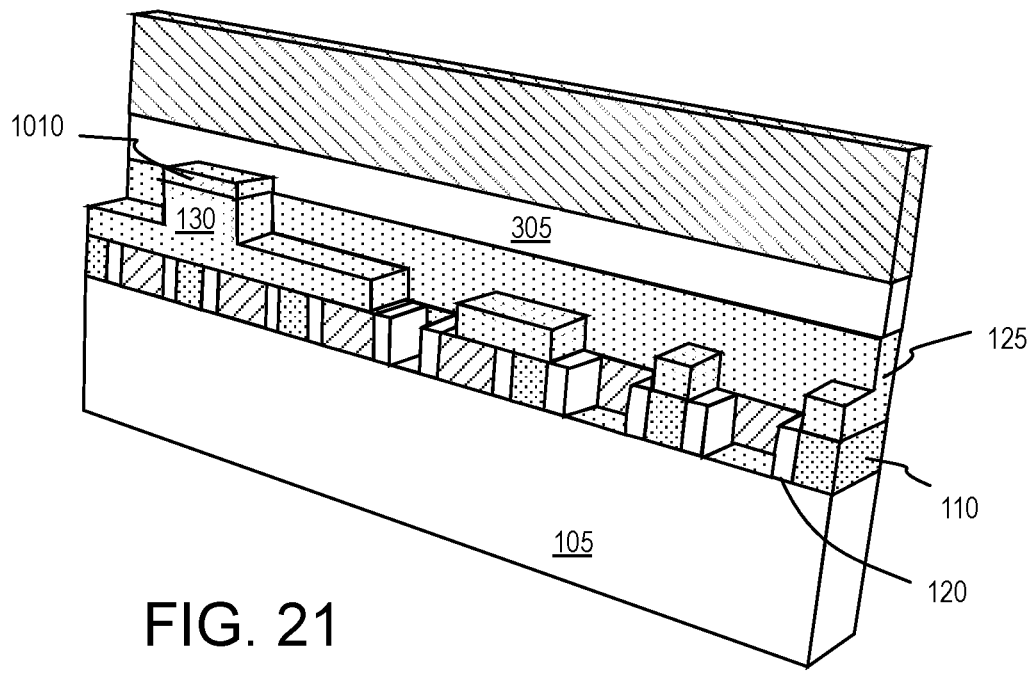
Figure 22:
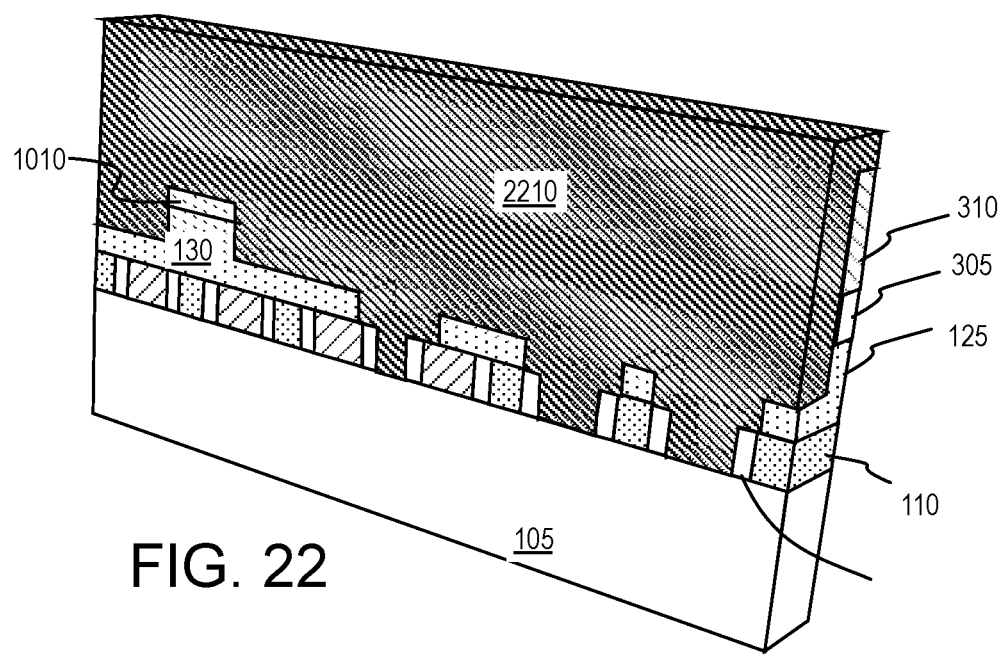

Returning to FIG. 2B, methods 202 continue at operation 245 where the mask features intersecting the grating mask lines is removed and the via opening(s) backfilled with mask backfill material. Mask feature removal may be selective, based on compositional differences, to retain the first grating mask lines. FIG. 17 illustrates one example of via and post structures following removal of mask features 1420 and mask backfill material 1510 (e.g., ashed where they are both carbon-based). Notably, mask lines 310 are retained, so removal of mask backfill material 1510 and mask features 1420 should be selective relative to mask lines 310. Compositions of these materials may be chosen in further view of this constraint. FIG. 18 further illustrates a backfilling of all vias and spaces between mask lines 310 with mask backfill material 1810. Mask backfill material 1810 may, for example, have the same composition as mask backfill material 1410. In some examples, mask backfill material 1810 is a carbonaceous material, such as, but not limited to DLC, Si-DLC, or any other known CHM composition. However, mask backfill material 1810 may alternatively be one of SiC, SiO, SiOC, HSQ, MSQ, or the like. Mask backfill material 1810 may then be recess etched to expose a top surface of interface ILD 305, as further shown in FIG. 19. Any etch process (e.g., anisotropic or isotropic) known to be suitable for the composition of mask backfill material 1810 may be employed. An amount of over-etch forms recesses 1910, but the depth of recesses 1910 is not critical.

With the via openings protected by mask backfill material and the interface ILD layer exposed, methods 202 (FIG. 2B) continue at operation 250 where the trench ILD layer is exposed by etching through the interface ILD layer within spaces between the first grating mask lines. Any anisotropic dielectric etch known to be suitable for removing such an ILD may be performed at operation 250. In some embodiments, the same etching process employed at operation 210 is again employed at operation 250, for example selectively stopping on the trench ILD layer. The etching may continue to recess the exposed surface of the trench ILD layer at operation 255 until reaching a desired trench depth. As described further below, the depth of the recess into the trench ILD layer determines, at least in part, the z-height of conductive trace(s) connected to the vias. For examples further illustrated by FIG. 20, interface ILD 305 has been anistropically etched following the edges of mask lines 310. A first etch process selective to trench ILD material 125 will stop on trench ILD material 125 and also not recess post 1010 significantly. A subsequent etch process suitable for recessing trench ILD material 125 ansiotropically will follow the edges of mask lines 310 and also recess post 1010, essentially translating the post pattern into a non-recessed portion of trench ILD 125. Following the ILD recess etch, mask backfill material 1810 may be stripped (e.g., ashed where it is carbon-based) to arrive at the structure illustrated in FIG. 21.

Figure 23:
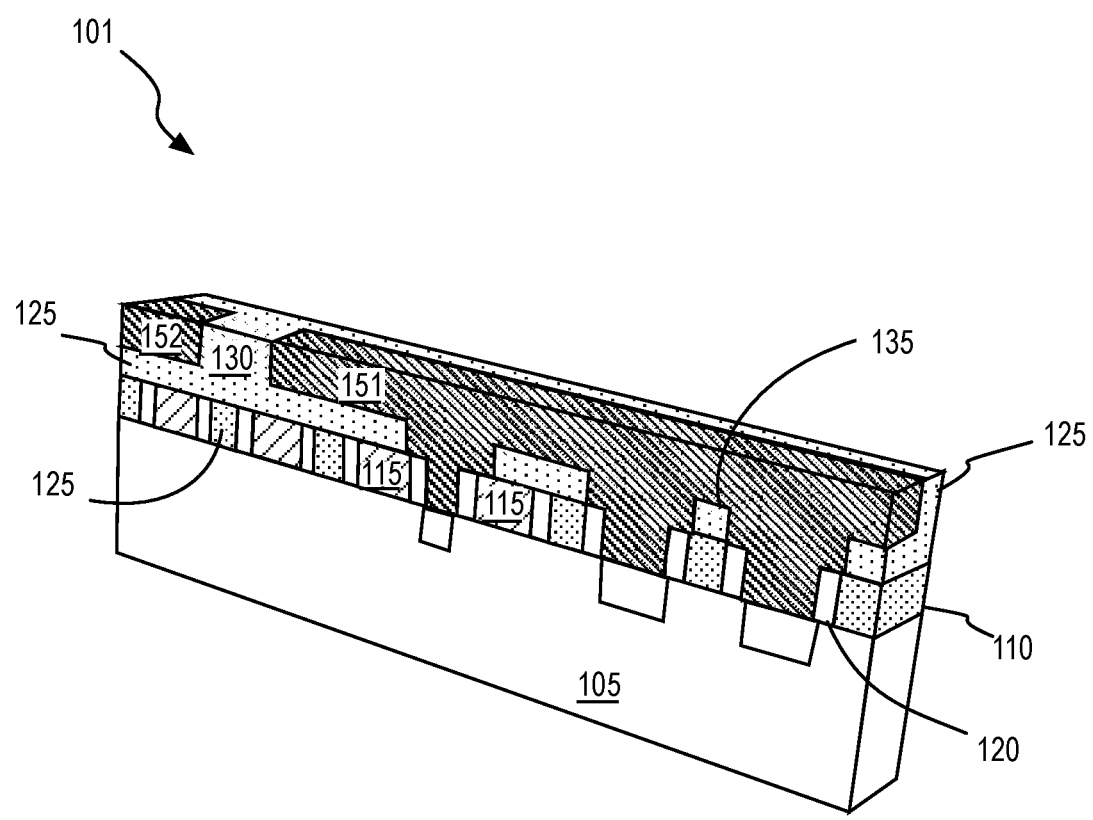

Methods 202 (FIG. 2B) are then completed by backfilling spaces of the first grating mask with a conductive material (e.g., metal) that is then further planarized with a top surface of the trench ILD. For examples further illustrated by FIG. 22, conductive material 2210 backfills spaces between mask lines 310, filling the vias down to base layer 105. Any suitable material and deposition process may be employed, such as, but not limited to, electrolytic plating of Cu. Deposition overburden may then be removed, for example by CMP. As shown in FIG. 23, the conductive trace planarization process finally removes mask lines 310, as well as remnants of interface ILD layer 305 to arrive at the plug and via dual-damascene interconnect structure introduced above in the context of FIGS. 1A and 1B. As further shown in FIG. 23, planarization of conductive material 2210 removes plug dielectric 1010 so that plug 130 is of the trench ILD 125 with no material interface between plug 130 and other regions of trench ILD 125 (either below plug 130 or adjacent to plug 130 and traces 151, 152).

In view of the above description, it will be appreciated that the technique of forming dielectric plugs and vias to dimensionally scale geometries of a dual damascene interconnect structure may be readily applied one or more times in an IC fabrication process, for example at one or more interconnect levels.

Figure 24:
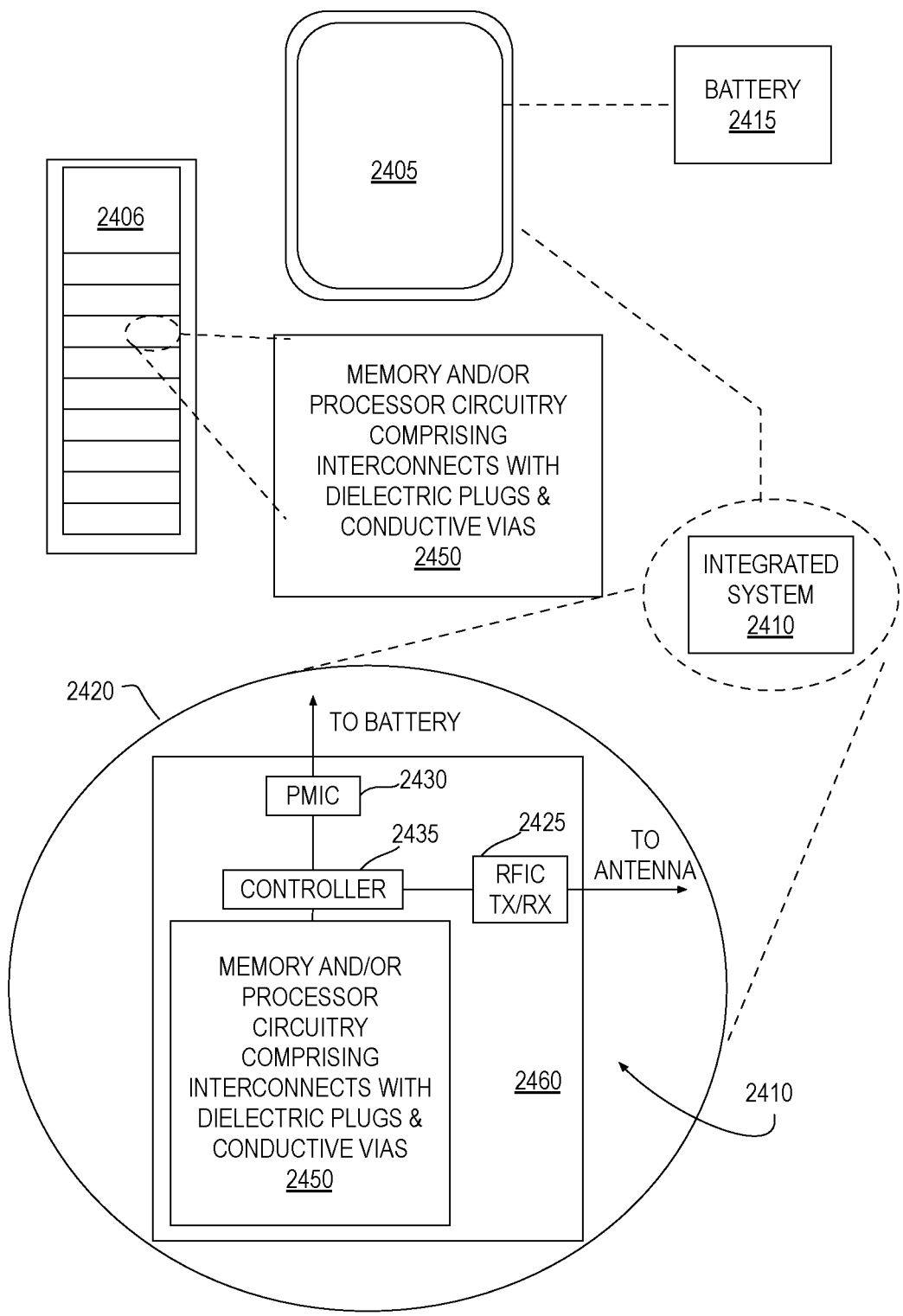
FIG. 24 illustrates a mobile computing platform and a data server machine employing an IC including via and plug architectures, in accordance with some embodiments.

FIG. 24 illustrates a mobile computing platform and a data server machine employing an IC including dimensionally scaled dual-damascene interconnect structures, for example including plugged conductive traces having one or more dielectric plugs and conductive vias in accordance with embodiments described herein. The server machine 2406 may be any commercial server, for example including any number of high-performance computing platforms disposed within a rack and networked together for electronic data processing, which in the exemplary embodiment includes a packaged monolithic SoC 2450. The mobile computing platform 2405 may be any portable device configured for each of electronic data display, electronic data processing, wireless electronic data transmission, or the like. For example, the mobile computing platform 2405 may be any of a tablet, a smart phone, laptop computer, etc., and may include a display screen (e.g., a capacitive, inductive, resistive, or optical touchscreen), a chip-level or package-level integrated system 2410, and a battery 2415.

Either disposed within the integrated system 2410 illustrated in the expanded view 2420, or as a stand-alone packaged chip within the server machine 2406, monolithic SoC 2450 includes a memory circuitry block (e.g., RAM), a processor circuitry block (e.g., a microprocessor, a multi-core microprocessor, graphics processor, or the like), either or both of which include dimensionally scaled dual-damascene interconnect structures (e.g., including plugged conductive traces having one or more dielectric plugs and conductive vias) in accordance with embodiments described herein. The monolithic SoC 2450 may be further coupled to a board, a substrate, or an interposer 2460 along with, one or more of a power management integrated circuit (PMIC) 2430, RF (wireless) integrated circuit (RFIC) 2425 including a wideband RF (wireless) transmitter and/or receiver (TX/RX) (e.g., including a digital baseband and an analog front end module further comprises a power amplifier on a transmit path and a low noise amplifier on a receive path), and a controller 2435. Any or all of RFIC 2425 and PMIC 2430 may also include dimensionally scaled dual-damascene interconnect structures, for example including plugged conductive traces having one or more dielectric plugs and conductive vias in accordance with embodiments described herein.

Functionally, PMIC 2430 may perform battery power regulation, DC-to-DC conversion, etc., and so has an input coupled to battery 2415 and with an output providing a current supply to other functional modules. As further illustrated, in the exemplary embodiment, RFIC 2425 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 4G, and beyond. Notably, each of these board-level IC modules 2425, 2430, 2435 may be integrated onto separate ICs or integrated into monolithic SoC 2450.

Figure 25:
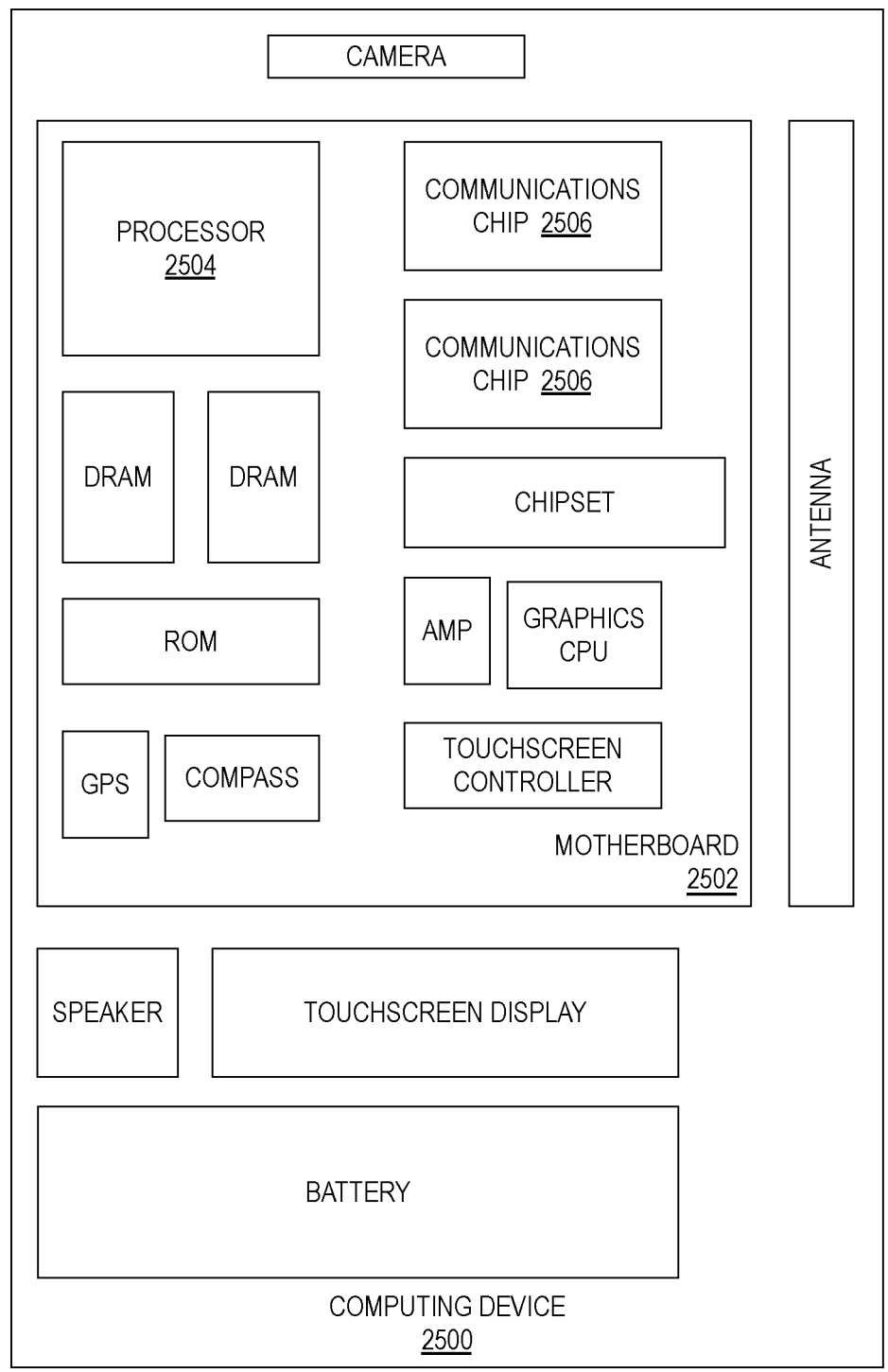
FIG. 25 is a functional block diagram of an electronic computing device, in accordance with some embodiments.

FIG. 25 is a functional block diagram of an electronic computing device, in accordance with some embodiments. Computing device 2500 may be found inside platform 2505 or server machine 2506, for example. Device 2500 further includes a motherboard 2502 hosting a number of components, such as, but not limited to, a processor 2504 (e.g., an applications processor), which may further incorporate scaled dual-damascene interconnect structures (e.g., including plugged conductive traces having one or more dielectric plugs and conductive vias) in accordance with embodiments described herein. Processor 2504 may be physically and/or electrically coupled to motherboard 2502. In some examples, processor 2504 includes an integrated circuit die packaged within the processor 2504. In general, the term "processor" or "microprocessor" may refer to any device or portion of a device that processes electronic data from registers and/or memory to transform that electronic data into other electronic data that may be further stored in registers and/or memory.

In various examples, one or more communication chips 2506 may also be physically and/or electrically coupled to the motherboard 2502. In further implementations, communication chips 2506 may be part of processor 2504. Depending on its applications, computing device 2500 may include other components that may or may not be physically and electrically coupled to motherboard 2502. These other components include, but are not limited to, volatile memory (e.g., DRAM), non-volatile memory (e.g., ROM), flash memory, a graphics processor, a digital signal processor, a crypto processor, a chipset, an antenna, touchscreen display, touchscreen controller, battery, audio codec, video codec, power amplifier, global positioning system (GPS) device, compass, accelerometer, gyroscope, speaker, camera, and mass storage device (such as hard disk drive, solid-state drive (SSD), compact disk (CD), digital versatile disk (DVD), and so forth), or the like.

Communication chips 2506 may enable wireless communications for the transfer of data to and from the computing device 2500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 2506 may implement any of a number of wireless standards or protocols, including but not limited to those described elsewhere herein. As discussed, computing device 2500 may include a plurality of communication chips 2506. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that principles of the disclosure are not limited to the embodiments so described, but can be practiced with modification and alteration without departing from the scope of the appended claims. For example the above embodiments may include specific combinations of features as further provided below.

In one or more first embodiments, a method of fabricating an integrated circuit (IC) interconnect structure comprises etching a first recess in one or more interlayer dielectric (ILD) material layers at a first mask opening located between a pair of first mask lines, and between a pair of second mask features, which intersect the first mask lines and backfill space between the first mask lines. The method comprises backfilling the first recess with a plug dielectric material. The method comprises etching a second recess in the ILD material layers at a second mask opening located between the first mask lines, and between a pair of third mask features, which intersect the first mask lines and backfill space between the first mask lines. The method further comprises forming a trench in the ILD material layers by etching a first portion of the ILD material layers exposed between the first mask lines, the edges of the trench aligned with edges of the first mask lines and the plug dielectric material. The method comprises backfilling the second recess and the trench with a conductive material, and forming a conductive trace within the trench by planarizing the conductive material with a second portion of the ILD material layers that was protected by the first mask lines.

In one or more second embodiments, for any of the first embodiments the first mask lines have a first material composition and the second mask features have a second composition, distinct from the first material composition. The third mask features have a composition distinct from at least the first material composition. The plug dielectric material has the same composition as at least one of the one of the ILD material layers, and forming the trench further comprises etching the plug dielectric material concurrently with the first portion of the ILD material layers to translate a plug shape into an underlying ILD material.

In one or more third embodiments, for any of the first or second embodiments the method further includes forming the pair of first mask lines extending lengthwise in a first direction over the one or more dielectric material layers, backfilling the second recess and the space between the first mask lines with a mask backfill material after removing the second and third mask features, recess etching the mask backfill material to expose the plug dielectric material and a top surface of the one or more dielectric layers prior forming the trench, removing the mask backfill material after forming the trench and prior to depositing the conductive material, and removing the first mask lines by planarizing the top surface of the conductive material the second portion of the ILD material layers.

In one or more fourth embodiments, for any of the first, second, or third embodiments the method further includes removing the second mask features before forming the third mask features, and forming the pair of second mask features further comprises backfilling the space between the pair of first mask lines a first time with a mask backfill material, and etching the mask backfill material into the second features based on a mask pattern comprising second mask lines disposed over the first mask lines and extending lengthwise in a second direction orthogonal to the first mask lines. Forming the pair of third mask features further comprises backfilling the space between the pair of first mask lines a second time with the mask backfill material, and etching the mask backfill material into the third features based on the mask pattern comprising the second mask lines.

In one or more fifth embodiments, for any of the first, second, third, or fourth embodiments etching the first recess further comprises etching an opening through an upper dielectric layer to expose a lower dielectric layer of a different composition than the upper dielectric layer, and backfilling the first recess further comprises backfilling space located between the pair of first mask lines and between the second mask features.

In one or more sixth embodiments, for any of the first, second, third, fourth, or fifth embodiments the ILD material layers include an upper and lower dielectric layer of differing composition disposed over a multi-color dielectric layer including stripes of dielectric material of a first composition interdigitated with stripes of dielectric material of a second composition. The first and second recesses are each disposed over a dielectric material stripe having the first composition, and the first and second recesses both expose regions of the lower dielectric layer that have substantially the same lateral dimensions.

In one or more seventh embodiments, for any of the sixth embodiments the method further comprises etching a third recess in the one or more dielectric material layers at a third mask opening located between the first mask lines and between a pair of fourth mask features that intersect the first mask lines and backfill space between the first mask lines, wherein the third recess is disposed over the dielectric material of the second composition.

In one or more eighth embodiments, for any of the sixth embodiments the second recess is backfilled with a mask backfill material prior to etching the third recess.

In one or more ninth embodiments, for any of the eighth embodiments the method further comprises removing the third mask features before forming the fourth mask features. Forming the pair of second mask features further comprises backfilling the space between the pair of first mask lines a first time with a mask backfill material, and etching the mask backfill material into the second features based on a mask pattern comprising second mask lines disposed over the first mask lines and extending lengthwise in a second direction orthogonal to the first mask lines. Forming the pair of third mask features further comprises backfilling the space between the pair of first mask lines a second time with the mask backfill material, and etching the mask backfill material into the third features based on the mask pattern comprising the second mask lines. Forming the pair of fourth mask features further comprises, backfilling the second recess with the mask backfill material, backfilling the space between the pair of first mask lines a third time with the mask backfill material, and etching the mask backfill material into the fourth features based on a mask pattern comprising third mask lines disposed over the first mask lines and extending lengthwise in the second direction, the third mask lines having a pitch approximately equal to that of the second mask lines, but shifted laterally by approximately half the pitch.

In one or more tenth embodiments, for any of the ninth embodiments the first mask lines have a composition that is predominantly other than carbon, the second, third and fourth mask features are predominantly carbon, and the mask backfill material is photosensitive.

In one or more eleventh embodiments, an integrated circuit (IC) interconnect structure, comprises a first lower-level conductive trace disposed over a substrate and extending lengthwise in a first direction. The structure comprises an upper-level conductive trace disposed over the first lower-level conductive trace with one or more first interlayer dielectric (ILD) material layers disposed there between, the upper-level conductive trace extending lengthwise over the substrate in a second direction, orthogonal to the first direction. The structure comprises a first conductive via extending through the first ILD material layers and electrically connecting the upper-level conductive trace to the first lower-level conductive trace, wherein the second conductive trace is spaced apart in the first direction from an adjacent conductive trace by one or more second ILD material layers, and the second conductive trace is spaced apart in the second direction from an adjacent conductive trace by a dielectric plug having a same lateral dimensions as the first conductive via.

In one or more twelfth embodiments, for any of the eleventh embodiments the first conductive via has a rectangular footprint over the substrate, and the dielectric plug defines an end sidewall surface of the upper-level conductive trace that is entirely parallel to a first sidewall surface of the first conductive via.

In one or more thirteenth embodiments, for any of the eleventh or twelfth embodiments the first conductive via has a second sidewall surface that orthogonally intersects the first sidewall surface, and is coincident with a sidewall surface of the upper-level conductive trace.

In one or more fourteenth embodiments, for any of the eleventh, twelfth, or thirteenth embodiments the dielectric plug has the same composition as at least one of second ILD material layers.

In one or more fifteenth embodiments, for any of the eleventh, twelfth, thirteenth, or fourteenth embodiments the first ILD material layers further comprise a first ILD material layer disposed over a multi-color dielectric layer that further includes stripes of dielectric material of a first composition interdigitated with stripes of dielectric material of a second composition, the stripes extending lengthwise in the first direction, and the dielectric plug and the conductive via are each aligned over a dielectric material stripe having the first composition.

In one or more sixteenth embodiments, for any of the fifteenth embodiments the structure further includes a second lower-level conductive trace disposed over a substrate and extending lengthwise in the first direction, and a second conductive via extending through the first ILD material layers and electrically connecting the upper-level conductive trace to the second lower-level conductive trace, wherein the second conductive via is aligned over a dielectric material stripe having the second composition.

In one or more seventeenth embodiments, for any of the sixteenth embodiments the structure further includes a third lower-level conductive trace disposed over a substrate and extending lengthwise in the first direction, and a third conductive via extending through the first ILD material layers and electrically connecting the upper-level conductive trace to the third lower-level conductive trace. The third conductive via is aligned over a dielectric material stripe having the second composition, and the second and third conductive vias are spaced apart by an intervening dielectric material stripe having the first composition, and by a residue of the first ILD material layer disposed over the intervening dielectric material stripe.

In one or more eighteenth embodiments, a method of fabricating an integrated circuit (IC) interconnect structure comprises patterning mask material that backfills spaces in a first grating mask to form second mask features intersecting lines of the first grating mask, exposing a lower interlayer dielectric (ILD) material by etching a plug opening through an upper ILD material layer, backfilling the plug opening with a plug dielectric material, removing the second mask features, patterning mask material that backfills spaces in the first grating mask to form third mask features intersecting the first grating, exposing a first lower-level conductive trace by etching a first via opening through intervening ILD material within a space between a pair of the third mask features, removing the third mask features, etching through at least a portion of the lower ILD material layer exposed within spaces of the grating mask, backfilling the first grating mask with conductive material, and planarizing the conductive material with the lower ILD material layer and the plug dielectric material.

In one or more nineteenth embodiments, for any of the eighteenth embodiments, etching the first via opening further comprises etching the via opening through a stripe of dielectric material having a first composition that is interdigitated with stripes of dielectric material of a second composition within a multi-colored dielectric layer, and etching the plug opening further comprises etching the plug opening in alignment with another stripe of dielectric material having the first composition.

In one or more twentieth embodiments, for any of the eighteenth or nineteenth embodiments, the plug opening and the first via opening have the same lateral dimensions.

In one or more twenty-first embodiments, a microprocessor comprises a plurality of transistors interconnected by one or more of the interconnect structures in any of the eleventh, twelfth, thirteenth, fourteenth, fifteenth, sixteenth, or seventeenth embodiments.

However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. An integrated circuit (IC) interconnect structure, comprising:
   a lower-level conductive trace over a substrate and extending lengthwise in a first direction;
   an upper-level conductive trace over the lower-level conductive trace with one or more first dielectric materials therebetween, the upper-level conductive trace extending lengthwise over the substrate in a second direction, orthogonal to the first direction; and
   a conductive via extending through at least one of the first dielectric materials and electrically connecting the upper-level conductive trace to the lower-level conductive trace, wherein:
   the upper-level conductive trace is spaced apart in the first direction from an adjacent second upper-level conductive trace by one or more second dielectric materials;
   the upper-level conductive trace is spaced apart in the second direction from an adjacent third upper-level conductive trace by a dielectric plug having lateral dimensions substantially equal to those of a top portion of the conductive via;
   the first dielectric materials further comprise a first dielectric material adjacent to the top portion of the conductive via and over first stripes of dielectric material of a first composition interdigitated with second stripes of dielectric material of a second composition, the first and second stripes extending lengthwise in the first direction, and the first and second stripes separated by an intervening third stripe of dielectric material of a third composition;
   the dielectric plug and the conductive via each occupy an area intersected by one of the first stripes of dielectric material; and
   a lower portion of the conductive via is in contact with two of the third stripes of dielectric material.

2. The IC interconnect structure of claim 1, wherein:
   the conductive via has a rectangular footprint over the substrate; and
   the dielectric plug defines an end surface of the upper-level conductive trace that is parallel to a first edge surface of the conductive via.

3. The IC interconnect structure of claim 2, wherein the upper and lower portions of the conductive via both have a second edge surface that orthogonally intersects the first edge surface, and is coincident with an edge surface of the upper-level conductive trace.

4. The IC interconnect structure of claim 3, wherein the dielectric plug has the same composition as at least one of second dielectric materials.

5. The IC interconnect structure of claim 1, further comprising: a second lower-level conductive trace over the substrate and extending lengthwise in the first direction; and a second conductive via extending through at least one of the first dielectric materials and electrically connecting the upper-level conductive trace to the second lower-level conductive trace, wherein the second conductive via occupies an area intersected by a first of the second dielectric material stripes.

6. The IC interconnect structure of claim 5, further comprising:
   a third lower-level conductive trace over the substrate and extending lengthwise in the first direction; and
   a third conductive via extending through the first dielectric materials and electrically connecting the upper-level conductive trace to the third lower-level conductive trace, wherein:
   the third conductive via occupies an area intersected by a second of the second dielectric material stripes; and
   the second and third conductive vias are spaced apart by an intervening one of the first dielectric material stripes, and by a residue of the first dielectric material over the intervening one of the first dielectric material stripes.

7. A microprocessor, comprising a plurality of transistors interconnected by at least the interconnect structure recited in claim 1.

* * * * *